(12) United States Patent
Okajima et al.

(10) Patent No.: US 11,956,942 B2
(45) Date of Patent: Apr. 9, 2024

(54) MEMORY DEVICE AND METHOD FOR MANUFACTURING THE SAME

(71) Applicant: Kioxia Corporation, Tokyo (JP)

(72) Inventors: Mutsumi Okajima, Mie (JP); Yasuaki Ootera, Kanagawa (JP); Tsutomu Nakanishi, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 159 days.

(21) Appl. No.: 17/472,190

(22) Filed: Sep. 10, 2021

(65) Prior Publication Data

US 2022/0310613 A1 Sep. 29, 2022

(30) Foreign Application Priority Data

Mar. 24, 2021 (JP) .................... 2021-049586

(51) Int. Cl.
*H10B 12/00* (2023.01)
*H01L 21/02* (2006.01)
*H01L 29/24* (2006.01)
*H01L 29/66* (2006.01)
*H01L 29/786* (2006.01)

(52) U.S. Cl.
CPC ....... *H10B 12/30* (2023.02); *H01L 21/02258* (2013.01); *H01L 21/02565* (2013.01); *H01L 29/24* (2013.01); *H01L 29/66969* (2013.01); *H01L 29/78642* (2013.01); *H01L 29/7869* (2013.01); *H10B 12/036* (2023.02); *H10B 12/05* (2023.02); *H10B 12/50* (2023.02)

(58) Field of Classification Search
CPC .......................... H10B 12/30; H01L 29/78642
See application file for complete search history.

(56) References Cited

U.S. PATENT DOCUMENTS 7,199,005 B2  4/2007  Sandhu et al.
7,393,741 B2  7/2008  Sandhu et al.
(Continued)

FOREIGN PATENT DOCUMENTS

JP       4221660 B2    2/2009
JP    2013-222784 A   10/2013

OTHER PUBLICATIONS

Masuda, Hideki, et al., "Long-Range-Ordered Anodic Porous Alumina with Less-Than-30 nm Hole Interval," Japanese Journal of Applied Physics, vol. 45, No. 43, 2006, pp. L1165-L1167.
(Continued)

*Primary Examiner* — Vincent Wall
(74) *Attorney, Agent, or Firm* — Foley & Lardner LLP

(57) ABSTRACT

According to one embodiment, a device includes: a circuit on a first surface of a substrate and including a first contact; an aluminum oxide layer above the substrate in a first direction perpendicular to the first surface; a cell including a capacitor provided in the aluminum oxide layer; a first conductive layer provided between the substrate and the aluminum oxide layer in the first direction and connected to the cell; a first insulating layer between the first conductive layer and the substrate in the first direction; a second insulating layer adjacent to the aluminum oxide layer in a second direction parallel to the first surface and provided above the substrate in the first direction; and a second contact in the second insulating layer and above the first contact in the first direction to connect the cell to the first contact.

11 Claims, 20 Drawing Sheets

(56) References Cited

U.S. PATENT DOCUMENTS

| | | | | |
|---|---|---|---|---|
| 7,659,164 | B1 | 2/2010 | Yoo | |
| 9,018,733 | B1* | 4/2015 | Lee | H01L 28/60 |
| | | | | 257/532 |
| 9,698,272 | B1* | 7/2017 | Ikeda | H01L 29/78642 |
| 10,014,345 | B1* | 7/2018 | Sugioka | H10N 50/80 |
| 10,079,237 | B2* | 9/2018 | Kim | H01L 28/86 |
| 2001/0026974 | A1* | 10/2001 | Reinberg | H01L 28/91 |
| | | | | 438/239 |
| 2006/0110936 | A1* | 5/2006 | Hill | H01L 21/02216 |
| | | | | 257/E21.271 |
| 2010/0078618 | A1* | 4/2010 | Xiao | H10N 70/20 |
| | | | | 257/3 |
| 2014/0361403 | A1* | 12/2014 | Cho | H01L 28/90 |
| | | | | 257/532 |
| 2019/0295626 | A1* | 9/2019 | Ikeda | G11C 11/404 |
| 2022/0285350 | A1* | 9/2022 | Okajima | H01L 29/78642 |
| 2022/0310613 | A1* | 9/2022 | Okajima | H01L 29/7869 |

OTHER PUBLICATIONS

Masuda, Hideki, et al., "Long-Range-Ordered Anodic Porous Alumina with Reduced Hole Interval Formed in Highly Concentrated Sulfuric Acid Solution," Japanese Journal of Applied Physics, vol. 45, No. 14, 2006, pp. L406-L408.

* cited by examiner

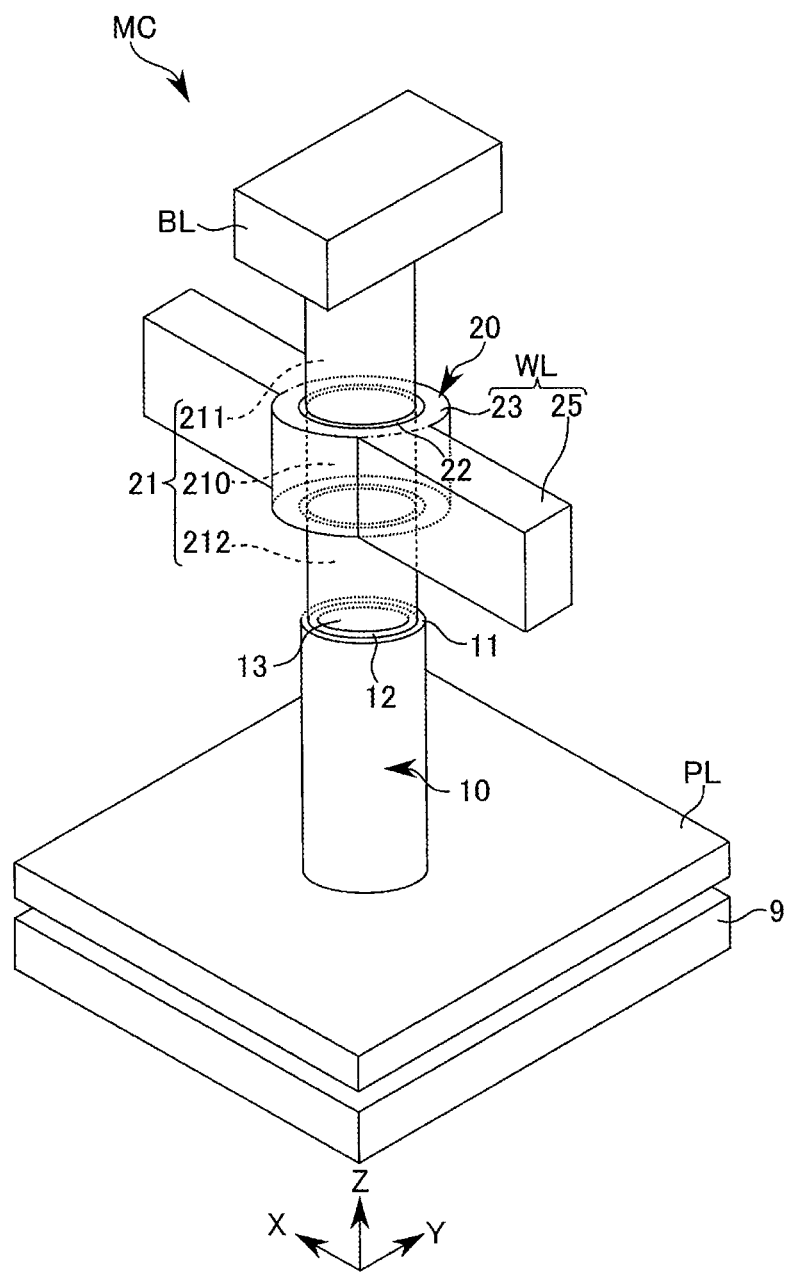
F I G. 3

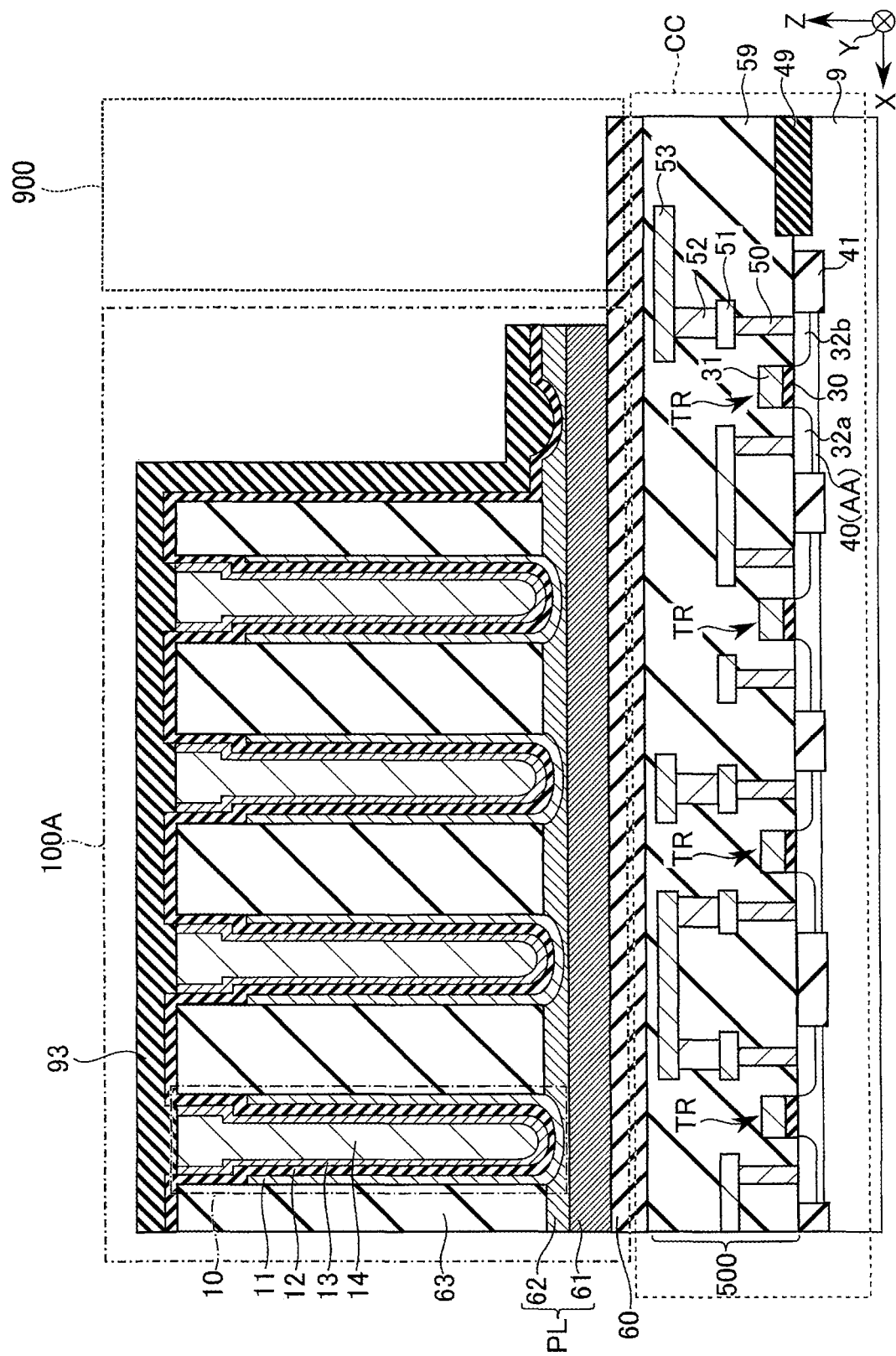
F I G. 15

MEMORY DEVICE AND METHOD FOR MANUFACTURING THE SAME

CROSS-REFERENCE TO RELATED APPLICATIONS

This application is based upon and claims the benefit of priority from Japanese Patent Application No. 2021-049586, filed Mar. 24, 2021, the entire contents of which are incorporated herein by reference.

FIELD

Embodiments described herein relate generally to a memory device and a method for manufacturing a memory device.

BACKGROUND

Research and development of memory devices with a novel configuration are promoted, as are research and development of a novel method for manufacturing the memory devices.

BRIEF DESCRIPTION OF THE DRAWINGS

FIG. 3 is a diagram showing an exemplary configuration of the memory cell of the memory device of the first embodiment.

FIGS. 8, 9, 10, 11, 12, 13, 14, 15, 16, 17 and 18 are sectional views each showing one step of a method for manufacturing the memory device of the first embodiment.

DETAILED DESCRIPTION

Embodiments

Figure 1:
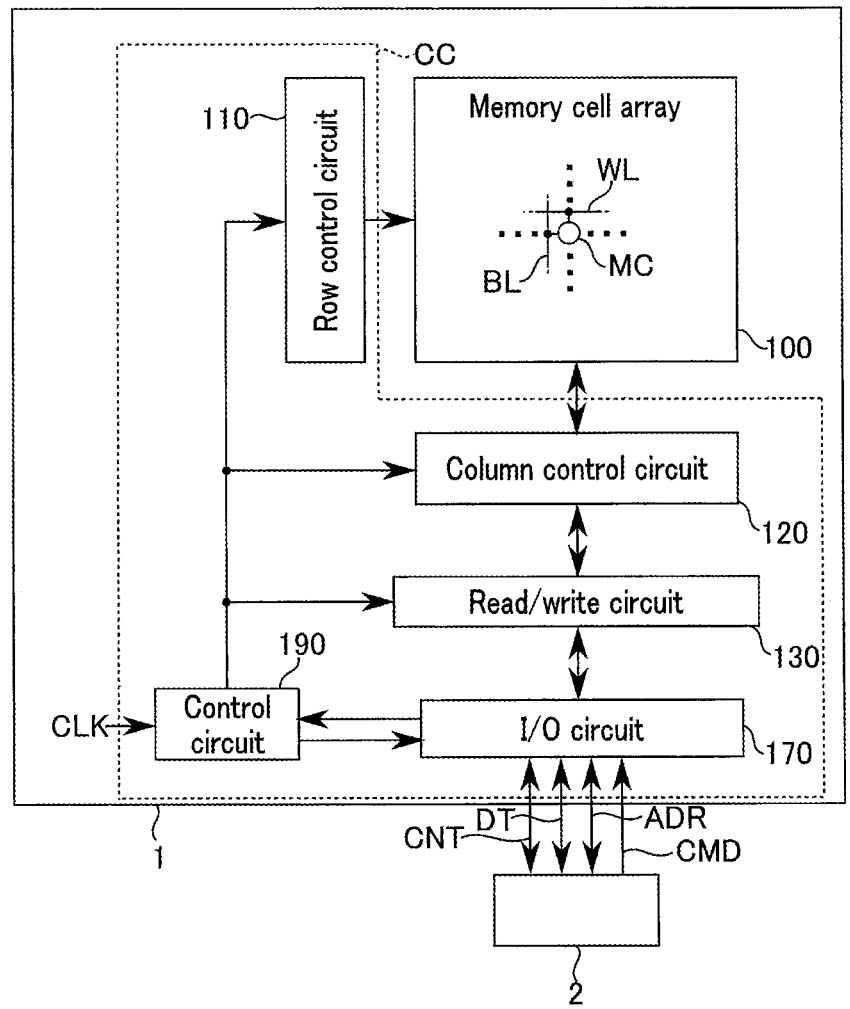
FIG. 1 is a block diagram showing an exemplary configuration of a memory device of a first embodiment.

A memory device of each of the embodiments and a method for manufacturing the memory device will be described with reference to FIGS. 1 through 20.

The embodiments will be described in detail with reference to the drawings. In the following descriptions, the elements having the same function and configuration are denoted by the same reference numeral or sign.

If the elements denoted by reference signs having numerals or letters at their ends (e.g. circuit, interconnects, and various voltages and signals) need not be distinguished from one another, the numerals or letters will be excluded.

In general, according to one embodiment, a memory device includes: a semiconductor substrate; a circuit provided on a first surface of the semiconductor substrate and including a first contact portion; an aluminum oxide layer provided above the semiconductor substrate in a first direction perpendicular to the first surface; a memory cell including a capacitor, the capacitor being provided in the aluminum oxide layer; a first conductive layer provided between the semiconductor substrate and the aluminum oxide layer in the first direction and electrically connected to the memory cell; a first insulating layer provided between the first conductive layer and the semiconductor substrate in the first direction; a second insulating layer adjacent to the aluminum oxide layer in a second direction parallel to the first surface and provided above the semiconductor substrate in the first direction; and a second contact portion provided in the second insulating layer and above the first contact portion in the first direction to electrically connect the memory cell to the first contact portion.

(1) First Embodiment

A memory device of the first embodiment and a method for manufacturing the memory device will be described with reference to FIGS. 1 through 18.

(a) Exemplary Configuration

An exemplary configuration of the memory device of the first embodiment will be described with reference to FIGS. 1 through 7.

<Circuit Configuration>

FIG. 1 is a block diagram showing an exemplary configuration of the memory device of the first embodiment.

As shown in FIG. 1, the memory device 1 of the first embodiment includes a memory cell array 100 and a memory control circuit CC.

The memory cell array 100 includes a plurality of memory cells MC, a plurality of word lines WL and a plurality of bit lines BL. Each of the memory cells MC is connected to at least one word line WL and at least one bit line BL. The memory cells MC can store data of one bit or more.

The memory device 1 of the first embodiment is, for example, a dynamic random access memory (DRAM). Each of the memory cells MC in the DRAM 1 includes a field-effect transistor (also referred to as a cell transistor hereinafter) and a capacitive element (also referred to as a cell capacitor hereinafter).

The memory cell array 100 and the memory cells MC will be described later more specifically.

The memory control circuit (also referred to as a CMOS circuit hereinafter) CC is a circuit group of a plurality of elements (e.g., field-effect transistors) formed on a semiconductor substrate (e.g., a silicon substrate).

The memory control circuit CC includes a row control circuit 110, a column control circuit 120, a read/write circuit 130, an input/output circuit 170, a control circuit 190, and the like.

The row control circuit 110 controls a plurality of rows of the memory cell array 100. The row control circuit 110 is supplied with an address decoding result (a row address). The row control circuit 110 sets a row (e.g., a word line), which is based on the address decoding result, in a selected state. Hereinafter, the row (or word line) set in a selected state will be referred to as a selected row (or a selected word line). Rows other than the selected row will be referred to as unselected rows (or unselected word lines).

The row control circuit 110 includes, for example, a multiplexer (a word line selection circuit) and a word line driver, and the like.

The column control circuit 120 controls a plurality of columns of the memory cell array 100. The column control circuit 120 is supplied with an address decoding result (a column address) from the control circuit 190. The column control circuit 120 sets a column (e.g., at least one bit line), which is based on the address decoding result, in a selected state. Hereinafter, the column (or bit line) set in a selected state will be referred to as a selected column (or a selected bit line). Columns other than the selected column will be referred to as unselected columns (or unselected bit lines).

The column control circuit 120 includes a multiplexer (bit line selection circuit), a bit line driver, and the like.

The read/write circuit 130 writes data to the memory cell array 100 (write operation) and reads data from the memory cell array 100 (read operation). In data write operation, the read/write circuit 130 transmits a signal (voltage or current) corresponding to write data to the memory cell array 100 via the column control circuit 120. In data read operation, the read/write circuit 130 receives a signal (voltage or current) corresponding to read data from the memory cell array 100 via the column control circuit 120. Note that a circuit for writing data and a circuit for reading data may be provided in the DRAM 1 independently of each other.

The input/output circuit (I/O circuit) 170 is an interface circuit for transferring various signals between the DRAM 1 and another device (referred to an external devices hereinafter) 2. In write operation, the I/O circuit 170 transfers data DT from the external device (controller or host device) 2 to the write circuit 140 as write data. In read operation, the I/O circuit 170 transfers data, which is output from the memory cell array 100 to the read circuit 150, to the external device 2 as read data. The I/O circuit 170 transfers an address ADR and a command CMD from the external device 2 to the control circuit 190. The I/O circuit 170 transfers various control signals CNT between the control circuit 190 and the external device 2.

The control circuit (also referred to as a sequencer hereinafter) 190 controls other circuits 110, 120, 130 and 170 based on the command CMD and the control signal CNT.

When the memory device 1 is a DRAM, the control circuit 190 controls and performs a refresh operation for data in the memory cell array 100 in addition to the write operation and the read operation.

For example, the control circuit 190 controls circuit 110 to 170 with timing synchronized with a clock signal CLK. As a result, the write operation, read operation and data transfer are performed with timing synchronized with the clock signal CLK. The clock signal CLK is generated in the interior of the DRAM 1A or supplied from the external device 2.

Note that the DRAM 1 may further include a refresh control circuit (not shown), a clock generation circuit (not shown), an internal voltage generation circuit (not shown), and the like.

(Memory Cell Array)

Figure 2:
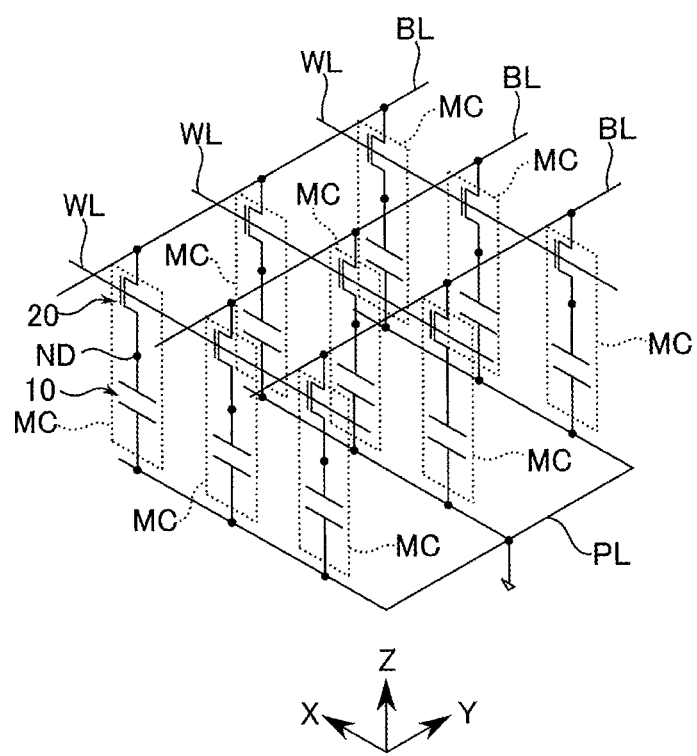
FIG. 2 is an equivalent circuit diagram of a memory cell array of the memory device of the first embodiment.

FIG. 2 is an equivalent circuit diagram illustrating an exemplary configuration of the memory cell array of the DRAM of the first embodiment.

As described above, the memory cell array 100 includes a plurality of memory cells MC.

The memory cells MC are arranged in a matrix in the X-Y plane of the memory cell array 100.

One terminal (one end) of each memory cell MC is connected to a bit line BL. The other terminal (other end) of the memory cell MC is connected to a plate line PL (also referred to as a plate electrode hereinafter). The control terminal of the memory cell MC is connected to a word line WL.

A plurality of memory cells MC arranged in the X direction are connected in common to one of the word lines WL. A plurality of memory cells MC arranged in the Y direction are connected in common to one of the bit lines BL. A plurality of memory cells MC in a certain control unit are connected to a common plate line PL.

Each memory cell MC includes a cell capacitor 10 and a cell transistor 20.

The cell capacitor 10 holds an amount of charge associated with data of one bit or more. The cell capacitor 10 functions as a memory element of the memory cell MC.

The cell transistor 20 switches a connection between the memory cell MC and the bit line BL. The cell transistor 20 functions as a selection element (also referred to as a switching element hereinafter) of the memory cell MC.

One terminal (one source/drain) of the cell transistor 20 is connected to the bit line BL as a terminal of the memory cell MC.

The other terminal (the other source/drain) of the cell transistor 20 is connected to one terminal (one end) of the cell capacitor 10 via a node ND. The other terminal (other end) of the cell capacitor 10 is connected to the plate line PL as a terminal of the memory cell MC. The gate of the cell transistor 20 is connected to the word line WL. The gate of the cell transistor 20 serves as a control terminal of the memory cell MC.

(Memory Cell)

FIG. 3 is a bird's eye view showing an exemplary configuration of a memory cell in the DRAM of the first embodiment.

As shown in FIG. 3, in the first embodiment, the cell transistor 20 overlaps the cell capacitor 10 vertically in the Z direction. The Z direction is perpendicular to the X-Y plane. The Z direction intersects the X and Y directions.

The cell capacitor 10 includes at least two electrodes 11 and 13 and an insulating layer 12. The insulating layer (also referred to as a capacitor insulating layer hereinafter) 12 is provided between the two electrodes (also referred to as capacitor electrodes) 11 and 13. One of the capacitor electrodes 11 is electrically connected to the plate line PL. The other capacitor electrode 13 is connected to the source/drain of the cell transistor 20.

At the bottom of the cell capacitor 10, the capacitor insulating layer 12 and the capacitor electrode 11 are provided between the capacitor electrode 13 and the plate line PL. The capacitor insulating layer 12 or the capacitor electrode 13 is not directly in contact with the plate line PL.

The cell transistor 20 includes at least a semiconductor layer 21, a gate insulating layer 22 and a gate electrode 23. The semiconductor layer (also referred to as a channel layer or a body portion hereinafter) 21 has a columnar structure extending in the Z direction. The gate electrode 23 faces the side (the surface of the semiconductor layer 21 along the Z direction) of the semiconductor layer 21 with the gate insulating layer 22 therebetween. The gate insulating layer 22 is provided between the side of the semiconductor layer 21 and the gate electrode 23.

Hereinafter, the columnar semiconductor layer 21 will also be referred to as a semiconductor pillar (or a channel pillar).

A channel region 210 of the cell transistor 20 is provided in the semiconductor layer 21. Two source/drain regions 211 and 212 of the cell transistor 20 are provided in the semiconductor layer 21. The channel region 210 is provided between the two source/drain regions 211 and 212.

In the first embodiment, the cell transistor 20 is a vertical transistor.

One of the two source/drain regions 211 and 212 (here, the source/drain region 211) is provided at one end (at the top) of the semiconductor layer 21 in the Z direction. The other of the two source/drain regions (here, the source/drain regions 212) is provided at the other end (at the bottom) of the semiconductor layer 21 in the Z direction. The two source/drain regions 211 and 212 of the vertical transistor 20 are arranged in the Z direction. One of the two source/drain regions 211 and 212 is placed above the other thereof in the Z direction.

The source/drain region 211 at the top of the cell transistor 20 is electrically connected to the bit line BL.

The source/drain region 212 at the bottom of the cell transistor 20 is electrically connected to the capacitor electrode 13.

Thus, the current path of the vertical cell transistor 20 is along the Z direction. The cell transistor 20 causes a current to flow in the Z direction.

In the first embodiment, the cell transistor 20 has a gate all around (GAA) structure. In the GAA structure cell transistor 20, the gate electrode 23 overlaps the entire side of the channel region 210 in the semiconductor layer 21. The gate electrode 23 annularly covers the side of the channel region 210 with the gate insulating layer 22 therebetween. Thus, the cell transistor 20 has high gate electrostatic controllability.

The gate electrode 23 is electrically connected to a conductive layer (also referred to as a gate interconnect) 25. The gate electrode 23 and gate interconnect 25 are a single continuous layer (interconnect) WL. The layer WL including the gate electrode 23 and conductive layer 25 functions as a word line. The layer WL is a word line WL and is used as the gate electrode 23 of the cell transistor 20.

In the first embodiment, the memory cell array 100 and memory cells MC are provided above a semiconductor substrate 9 in the Z direction.

In the first embodiment, the cell capacitor 10 is provided in the hole of an aluminum oxide layer (also referred to as an alumina layer hereinafter).

For example, the aluminum oxide layer is a porous aluminum oxide layer.

<Exemplary Configuration>

An exemplary configuration of the DRAM of the first embodiment will be described with reference to FIGS. 4 through 7.

Figure 4:
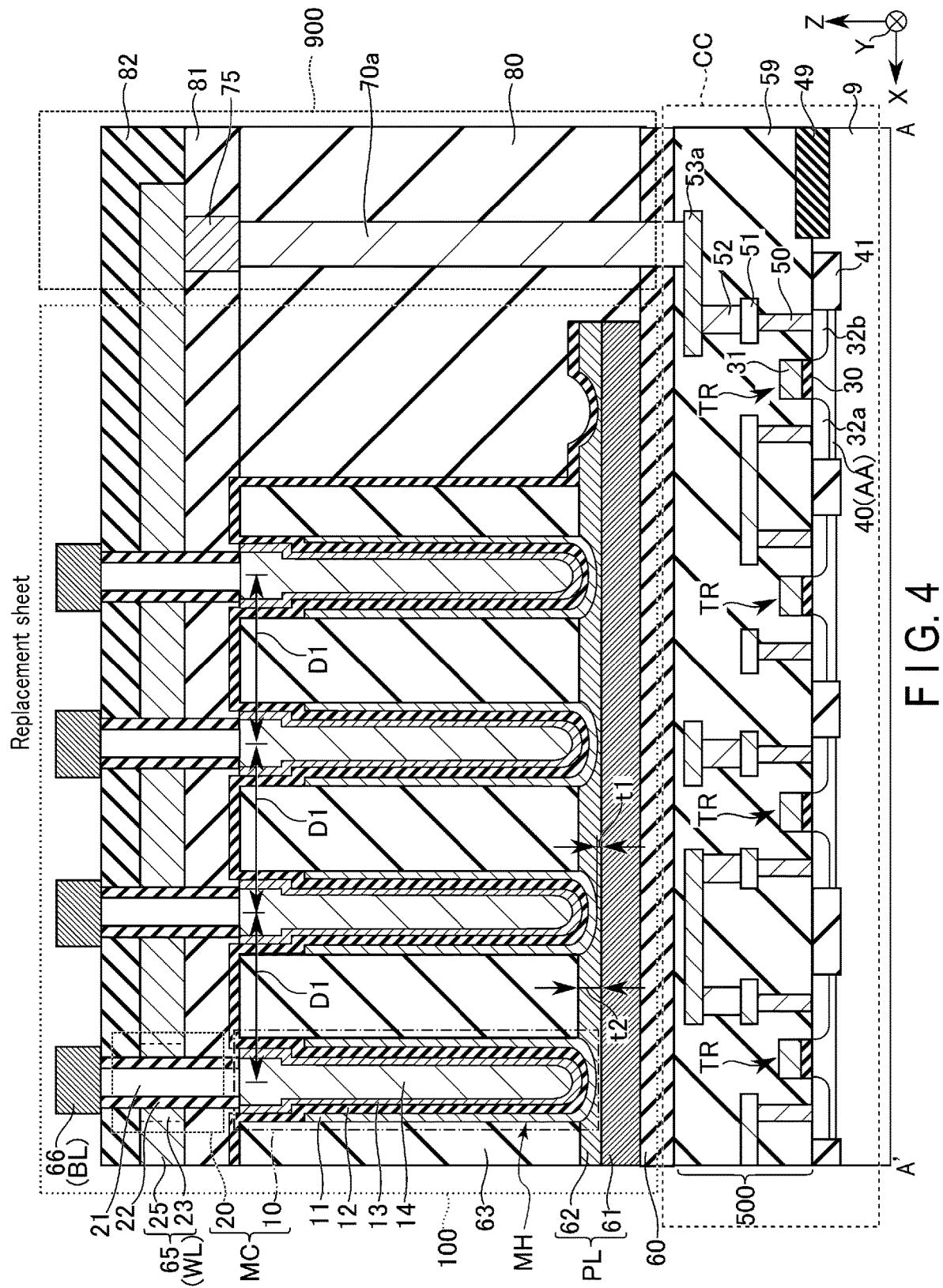
FIGS. 4, 5 and 6 are sectional views showing an exemplary configuration of the memory device of the first embodiment.
Figure 5:
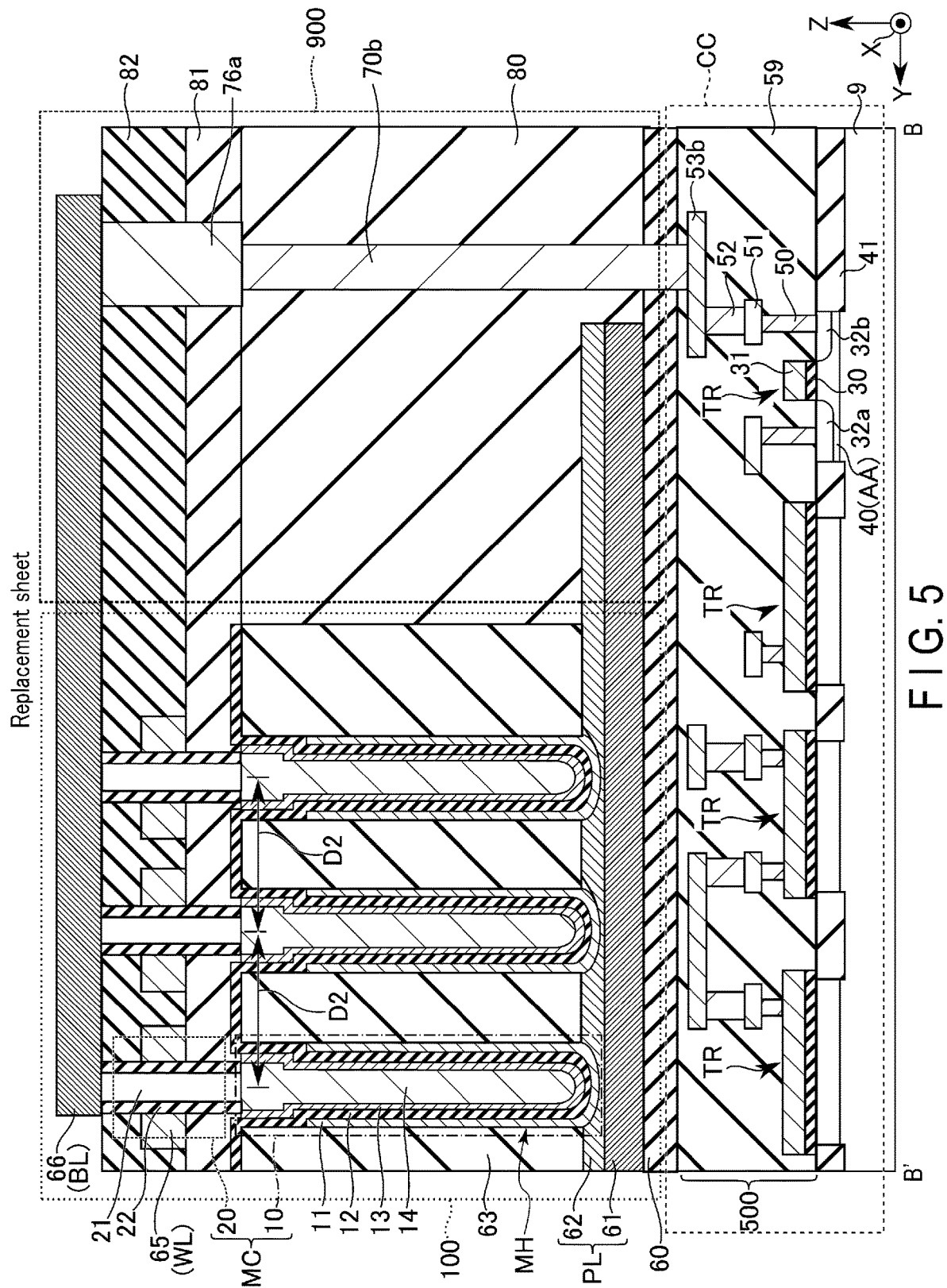
Figure 6:
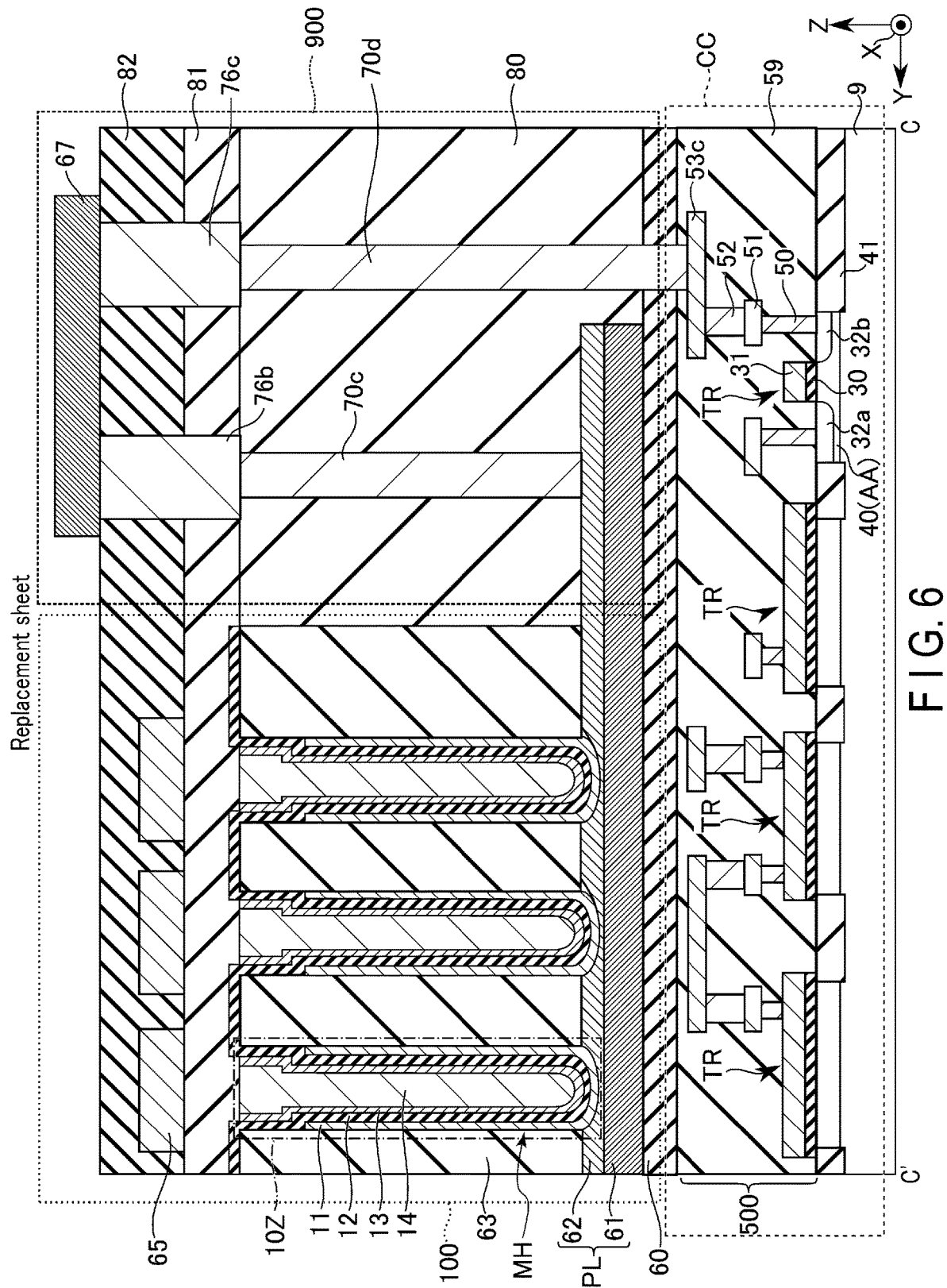

FIGS. 4 through 6 are sectional views showing an exemplary configuration of the DRAM of the first embodiment. In FIG. 4, a section (Y-Z plane) of a DRAM 1 along the X direction is shown. In FIGS. 5 and 6, a section (Y-Z plane) of the DRAM 1 along the Y direction is shown.

Figure 7:
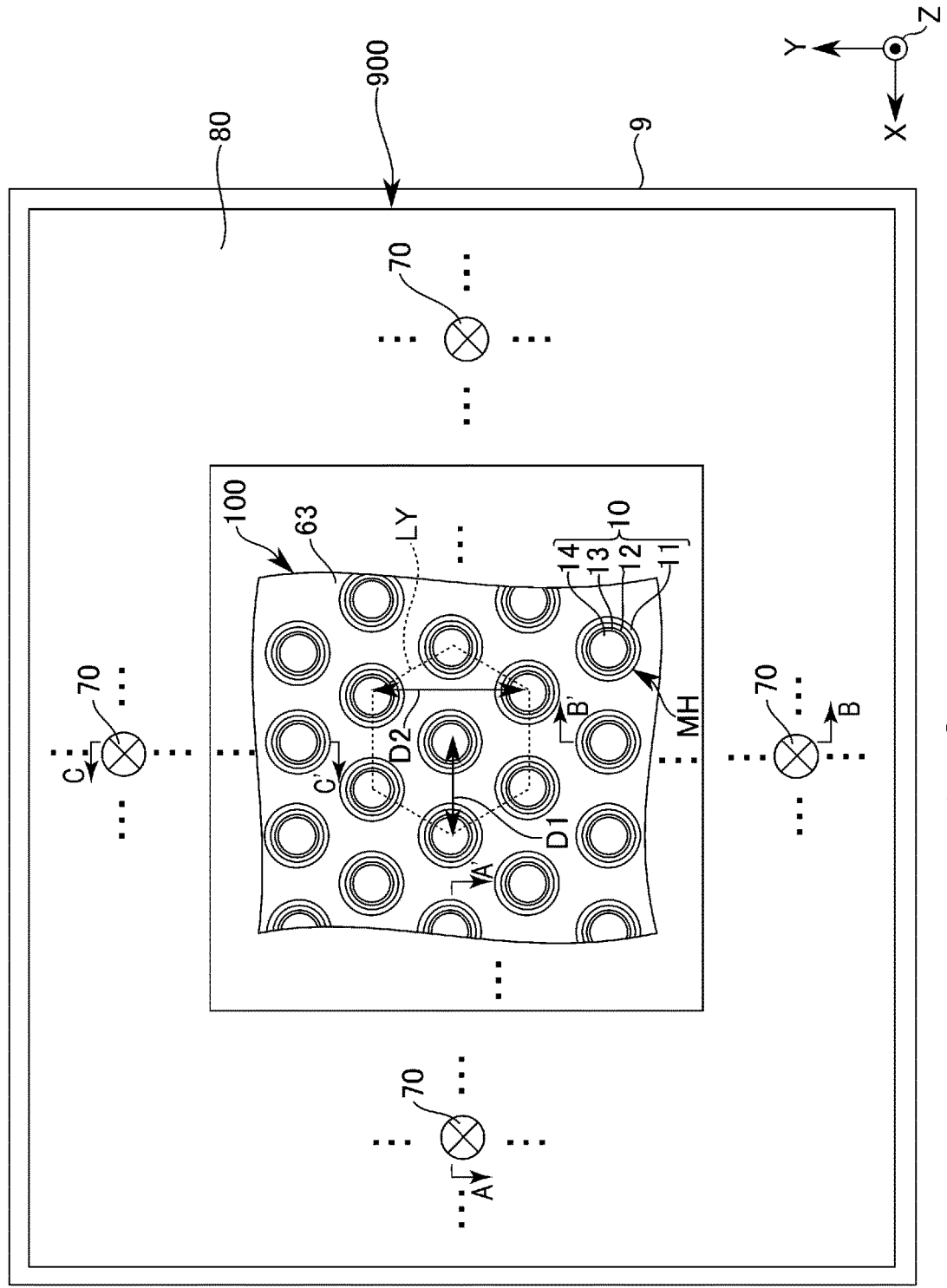
FIG. 7 is a top view showing an exemplary configuration of the memory device of the first embodiment.

FIG. 7 is a top view showing an exemplary configuration of the DRAM of the first embodiment. In FIG. 7, a plane (X-Y) of the memory cell array as viewed from the Z direction of the DRAM 1 is shown.

As shown in FIGS. 4 to 6, the DRAM 1 of the first embodiment has a structure in which the memory cell array 100 is stacked on the memory control circuit CC on the surface side of the semiconductor substrate 9.

The memory control circuit CC is provided on the surface (first surface) of the semiconductor substrate (e.g., silicon substrate) 9.

The memory cell array 100 is provided above the memory control circuit CC in a direction (Z direction) perpendicular to the surface of the semiconductor substrate 9.

The memory control circuit CC includes a plurality of field effect transistors (also referred to simply as transistors) TR. The transistors TR constitute each of the circuits 110, 120, 130, 170 and 190 other than the memory cell array of the DRAM 1. Each transistor TR is provided in active area AA in the semiconductor substrate 9. The active area AA is a semiconductor region isolated by an element isolation region (an insulating layer 41) in the semiconductor substrate 9.

A well region 40 of a certain conductivity type is provided in the active area AA. The conductivity type of the well region 40 corresponds to that (n-channel type or p-channel type) of the transistors TR.

A gate electrode 31 of each transistor TR is provided above the well region 40 with a gate insulating layer 30 therebetween in the Z direction. The gate insulating layer 30 is provided between the gate electrode 31 and the well region 40. The source/drain regions 32a and 32b of the transistor TR are provided in the well region 40. The source/drain regions 32a and 32b sandwich a channel region of the transistor TR in a direction parallel to the upper surface of the semiconductor substrate 9. The gate electrode 31 is opposed to the channel region in the well region 40 with the gate insulating layer 30 therebetween.

The gate electrode 31 of the transistor TR is covered with an interlayer insulating layer 59 on the semiconductor substrate 9. The interlayer insulating layer 59 includes a plurality of plugs (contacts) 50 and 52 and conductive layers (pads or interconnects) 51 and 53 (53a, 53b, 53c).

The plug 50 is provided on the source/drain region 32 (32a, 32b). The conductive layer (intermediate interconnect) 51 is connected to the source/drain region 32 via the plug 50. The plug 52 is provided on the conductive layer 51. The conductive layer 53 is provided above the conductive layer 51. The conductive layer 53 is connected to the conductive layer 51 via the plug 52.

As described above, the memory control circuit CC includes a multilevel interconnect structure 500 configured by the plugs 50 and 52 and conductive layers 51 and 53 in the interlayer insulating layer 59. In the multilevel interconnect structure 500, the conductive layers 51 and 53 are layered in the Z direction. In the first embodiment, the layers in the multilevel interconnect structure 500 including the conductive layers 51 and 53 are called interconnect levels. The interconnect levels indicate the position (height) of the interconnects (conductive layers) in a direction perpendicular to the surface of the semiconductor substrate 9.

For example, an alignment mark 49 is provided in an area (referred to as an alignment mark area) of the semiconductor substrate 9. In a manufacturing process of forming the DRAM 1, alignment between members (e.g., alignment between a mask and a semiconductor substrate at the time of lithography) is performed using the alignment mark 49.

Note that the alignment mark 49 may be provided in the multilevel interconnect structure 500.

The memory cell array 100 includes an aluminum oxide layer 63. The aluminum oxide layer 63 is provided above the semiconductor substrate 9 in the Z direction. The aluminum oxide layer 63 is a porous layer having a plurality of holes (also referred to as alumina holes hereinafter) MH. The alumina holes MH extend in the Z direction.

The cell capacitor 10 is provided in the aluminum oxide layer 63. The cell transistor 20 is provided above the aluminum oxide layer 63 in the Z direction.

The cell capacitor 10 is disposed between the cell transistor 20 and the memory control circuit CC in the Z direction.

FIG. 7 shows an exemplary layout of a plurality of capacitors (memory cells) in the memory cell array 100 in the DRAM of the first embodiment.

The cell capacitors 10 are arranged in the X-Y plane of the memory cell array 100 (aluminum oxide layer 63) by the layout (pattern) of a hexagonal lattice array LY when viewed from the Z direction. One unit of the hexagonal lattice array LY includes seven cell capacitors 10. In the layout of the seven cell capacitors 10 in the hexagonal lattice array LY, six cell capacitors 10 are disposed at their respective apexes of a hexagon and the remaining one cell capacitor 10 is disposed at the center of the hexagon.

For example, two cell capacitors 10 are arranged at pitch D1 in the X direction, and two cell capacitors 10 are arranged at pitch D2 in the Y direction.

In accordance with the layout of the cell capacitors 10, the cell transistors 20 and the memory cells MC (and the alumina holes MH) are arranged in the memory cell array 100 in a hexagonal lattice layout.

Returning to FIGS. 4 thorough 6, the structure of a memory cell MC will be described.

The cell capacitor 10 is provided in the alumina hole MH of an aluminum oxide layer 63 formed by anodic oxidation.

The cell capacitor 10 includes two capacitor electrodes 11 and 13, a capacitor insulating layer 12 and a storage node electrode (embedded electrode) 14.

The storage node electrode 14 is shaped like a column (or an elliptic cylinder). The storage node electrode 14 has a circular (or elliptical) planar shape when viewed from the Z direction.

The capacitor electrode 11 faces the side and bottom of the storage node electrode 14. The capacitor electrode 11 has a cylindrical (cup-shaped) structure. For example, the capacitor electrode 11 includes a cylindrical portion extending in the Z direction and a bottom portion having a circular (or elliptical) planar shape to which the cylindrical portion is connected.

The capacitor electrode 13 faces the side and bottom of the capacitor electrode 11 with the capacitor insulating layer 12 therebetween. The capacitor electrode 13 is provided between the storage node electrode 14 and the capacitor insulating layer 12. The capacitor electrode 13 has a cylindrical (cup-shaped) structure. For example, the capacitor electrode 13 includes a cylindrical portion extending in the Z direction and a bottom portion having a circular (or elliptical) planar shape to which the cylindrical portion is connected.

Note that the capacitor electrode 13 and the storage node electrode 14 may be a single structure made of one material.

The capacitor insulating layer 12 is provided between the capacitor electrodes 11 and 13. The capacitor insulating layer 12 faces the side and bottom of the capacitor electrode 11. The capacitor insulating layer 12 has a cylindrical structure. For example, the capacitor insulating layer 12 includes a cylindrical portion extending in the Z direction and a bottom portion having a circular (or elliptical) planar shape to which the cylindrical portion is connected.

The capacitor electrode 11 and the capacitor insulating layer 12 are provided between the capacitor electrode 13 and the conductive layer 62. The capacitor electrode 11 is directly connected to the plate electrode PL. The capacitor electrode 13 is separated from the plate electrode PL.

The capacitor electrodes 11 and 13 include a conductive compound layer (e.g., a titanium nitride layer). The capacitor insulating layer 12 includes a single-layered or multi-layered high dielectric layer (e.g., a zirconium oxide layer or an aluminum oxide layer). The storage node electrode 14 includes a metal layer (e.g., a tungsten layer) or a conductive semiconductor layer (e.g., a polysilicon layer).

Note that the materials of the members 11, 12, 13 and 14 of the cell capacitor 10 are not limited to those described above.

A plurality of cell transistors (vertical field effect transistors having a GAA structure) 20 are arranged in the X-Y plane in a hexagonal lattice. In each of the memory cells MC, a cell transistor 20 overlaps the cell capacitor 10 in the Z direction. The cell transistor 20 is provided above the cell capacitor 10 and the memory control circuit CC in the Z direction. The cell transistor 20 is located below the bit line BL and above the plate line PL in the Z direction.

As described above, the cell transistor 20 includes a semiconductor layer 21, a gate insulating layer 22 and a gate electrode 23. The source/drain region and channel region of the cell transistor 20 are provided in the semiconductor layer 21.

The semiconductor layer 21 has a columnar structure extending in the Z direction. The planar shape of the semiconductor layer 21 is circular. The semiconductor layer 21 extends in the Z direction through a plurality of layers 81, 65 and 82 stacked in the Z direction. The semiconductor layer 21 is an oxide semiconductor layer. For example, when an oxide semiconductor layer such as InGaZnO and InAlZnO is used in a semiconductor layer 21 including a channel region of the cell transistor, the cell transistor 81 is improved in its off-leak characteristics.

Note that the semiconductor layer 21 may be a silicon layer, a germanium layer and a compound semiconductor layer.

The gate insulating layer 22 has a cylindrical structure extending in the Z direction. The gate insulating layer 22 covers the side of the semiconductor layer 21. The cylindrical gate insulating layer 22 is concentric with the cylindrical semiconductor layer 21. The gate insulating layer 22 is provided on the side of the semiconductor layer 21. The gate insulating layer 22 is provided between the semiconductor layer 21 and the gate electrode 23.

The gate insulating layer 22 includes, for example, at least one of a silicon oxide layer and a high dielectric insulating film. The gate insulating layer 22 may have a single layer structure or a stacked layer structure.

A plurality of conductive layers 65 are provided on the insulating layer 81 above the aluminum oxide layer 63 in the Z direction. The conductive layers 65 extend in the X direction. Each of the conductive layers 65 includes a gate electrode 23 and a gate interconnect 25. The gate electrode 23 and gate interconnect 25 are a single continuous layer 65. The semiconductor layer 21 is formed through the conductive layers 65.

The gate electrode 23 is opposed to the side of the semiconductor layer 21 with the gate insulating layer 21 therebetween. Part of the semiconductor layer 21 opposed to the gate electrode 23 serves as an effective channel region of the cell transistor 20. The gate electrode 23 may have a cylindrical structure, for example.

The gate electrode 23 is connected to the gate interconnect 25. The gate electrodes 23 of adjacent cell transistors 20 in the X direction are connected via the gate interconnect 25. The gate electrodes 23 and gate interconnect 25 function as word lines WL.

A conductive layer 65 including the gate electrodes 23 and gate interconnect 25 is, for example, a metal layer such as a tungsten layer, a conductive semiconductor layer or a conductive compound layer.

A plurality of conductive layers 66 are provided on the insulating layer 82 above the conductive layers 65 (word lines WL) in the Z direction. The insulating layer 82 covers the conductive layers 65. The conductive layers 66 extend in the Y direction. However, the conductive layers 66 may have a portion parallel to the X-Y plane and extending obliquely to the X and Y directions.

The conductive layers 66 function as bit lines BL. The bit lines BL are provided to overlap the cell transistor 20 in the Z direction. For example, the bit lines BL are provided above the cell transistor 20 in the Z direction. The bit lines BL are electrically connected to the semiconductor layer 21. The bit lines BL may be electrically connected to the semiconductor layer 21 via a plug (not shown).

The conductive layers 66 may be, for example, a metal layer such as an aluminum layer and a copper layer, a conductive semiconductor layer, or a conductive compound layer.

The plate electrode (plate line) PL is provided between the memory cell array 100 and the memory control circuit CC in the Z direction. More specifically, the plate electrode PL is disposed between the cell capacitor 10 and the multilevel interconnect structure 500 in the Z direction.

The plate electrode PL includes two conductive layers (also referred to as plate electrode layers hereinafter) 61 and 62. The conductive layer 61 is provided between the conductive layer 62 and the insulating layer 60. The conductive layer 62 is provided between the conductive layer 61 and the aluminum oxide layer 63. The conductive layer 62 is in direct contact with the capacitor electrode 11. The conductive layer 61 is electrically connected to the capacitor electrode 11 via the conductive layer 62.

The conductive layer 61 includes a metal layer (e.g., a tungsten layer). The conductive layer 62 includes a conductive compound layer (e.g., a titanium nitride layer). The materials of the plate electrode layers 61 and 62 are not limited to those described above.

The conductive layer 61 has a plate-like structure extending in the X-Y plane. The plate-like conductive layer 61 is electrically connected in common to a plurality of cell capacitors 10 arranged two-dimensionally as a main part of the plate line PL. For example, the conductive layer 61 has a more uniform film thickness than that of the conductive layer 62.

The conductive layer 62 has a recess, for example, below the cell capacitor 10 in the Z direction (at the bottom of the cell capacitor 10). The film thickness (dimension in the Z direction) t1 of the conductive layer 62 below the cell capacitor 10 is smaller than the film thickness t2 of the conductive layer 62 below the aluminum oxide layer 63.

Note that the conductive layer 62 may not be provided between the capacitor electrode 11 and the conductive layer 61. Even in this case, the conductive layer 62 is preferably provided between the aluminum oxide layer 63 and the conductive layer 61. However, the plate electrode PL may have a single-layer structure of the conductive layer 61 without including the conductive layer 62.

The insulating layer 60 functions as a protective layer of the memory control circuit CC in the manufacturing process, as will be described later. The insulating layer 60 is, for example, an oxide layer, a nitride layer or an oxynitride layer. The insulating layer 60 may be a layer continuous to the insulating layer of the multilevel interconnect structure 500.

In the first embodiment, the aluminum oxide layer 63 is adjacent to the insulating layer 80 in directions (X and Y directions) parallel to the surface of the semiconductor substrate 9. The material of the insulating layer 80 differs from that of the aluminum oxide. For example, the insulating layer 80 is a layer containing silicon oxide.

A plurality of contact plugs 70 (70a, 70b, 70c) are provided in the insulating layer 80. The contact plugs 70 extend in the Z direction. The contact plugs 70 are arranged in the memory cell array 100 in the X direction or the Y direction. In the Z direction, the contact plugs 70 penetrate regions which are adjacent to each other in the X direction or the Y direction in the memory cell array 100.

The contact plugs 70 electrically connect the interconnect of the memory cell array 100 to that of the memory control circuit CC.

In the example of FIG. 4, one end (bottom portion) of the contact plug 70a is in contact with the top surface of the conductive layer 53a of the memory control circuit CC. The other end (top portion) of the contact plug 70a is in contact with the bottom surface of a plug 75 connected to the conductive layer 65 of the memory cell array 100.

FIG. 4 shows a structure in which the contact plug 70a is connected to the interconnect (here, the conductive layer 65) of the memory cell array 100 via the plug 75. However, the contact plug 70a may be in direct contact with the interconnect 65 of the memory cell array 100 and may be connected to the interconnect 65 without using another plug therebetween.

In the example of FIG. 5, one end (bottom portion) of the contact plug 70b is in contact with the top surface of the conductive layer 53b of the memory control circuit CC. The other end (top portion) of the contact plug 70b is in contact with the bottom surface of a plug 76a connected to the conductive layer 66 of the memory cell array 100.

FIG. 5 shows a structure in which the contact plug 70b is connected to the interconnect (here, the conductive layer 66) of the memory cell array 100 via the plug 76a. However, the contact plug 70b may be in direct contact with the interconnect 66 of the memory cell array 100 and may be connected to the interconnect 66 without using another plug therebetween.

In the example of FIG. 6, one end of the contact plug 70c is in contact with the top surface of the conductive layer 62 of the plate electrode PL. The other end of the contact plug 70c is in contact with the bottom surface of the conductive layer 67 on the insulating layer 82 through a plug 76b in the insulating layers 81 and 82. One end of a contact plug 70d is in contact with the top surface of the conductive layer 53c of the memory control circuit CC. The other end of the contact plug 70d is in contact with the bottom surface of the conductive layer 67 through a plug 76c in the insulating layers 81 and 82. The conductive layer 67 electrically connects the two contact plugs 70c and 70d.

The plate electrode PL is connected to the interconnect (conductive layer 53c) of the memory control circuit CC provided at a position lower than the position of a cell capacitor 10Z through the conductive layer 67 provided at a position higher than the position of the cell capacitor 10Z by the contact plugs 70a and 70b arranged in the Y direction.

Note that the plate electrode PL may be connected to the conductive layer in the memory control circuit CC via a contact plug aligned with the contact plug 70c in the X direction.

For example, the cell capacitor 10Z is a cell capacitor of a dummy cell that is not used to store user data. In the dummy cell, a cell transistor may be provided on the cell capacitor 10Z.

In the first embodiment, an area 900 where the contact plugs 70 are arranged above the memory control circuit CC in the Z direction is called a contact area 900. Hereinafter, an area where the memory cell array 100 is placed is also called a memory cell array area.

For example, as shown in FIG. 7, the contact area 900 (and the insulating layer 80) is provided above the semiconductor substrate 9 in the Z direction so as to surround the memory cell array 100 (aluminum oxide layer 63) in the X and Y directions.

The contact area 900 overlaps the memory control circuit CC in the Z direction. The interconnect (e.g., bit lines BL, word lines WL and plate line PL) in the memory cell array 100 extends from the memory cell array (memory cell array area) 100 to the contact area 900. The interconnect in the memory cell array 100 is electrically connected to a lower memory control circuit CC (interconnect in the multilevel interconnect structure 500) in the contact area 900 via the contact plugs 70.

As described above, in the aluminum oxide layer 63, the alumina holes MH are regularly arranged at predetermined pitches (intervals) D1 and D2 in the X direction or the Y direction. The alumina holes MH are laid out in an X-Y plane in a hexagonal lattice array LY.

For example, the aluminum oxide layer 63 including the alumina holes MH is formed by an anodic oxidation process.

The first embodiment can thus provide a DRAM with high storage density and/or low bit costs.

The DRAM 1 of the first embodiment performs various types of operation sequence such as a write operation and a read operation by the well-known operation. The description of the operation of the DRAM 1 is therefore omitted in the first embodiment.

(b) Manufacturing Method

A method for manufacturing the DRAM of the first embodiment will be described with reference to FIGS. 8 to 18.

Figure 8:
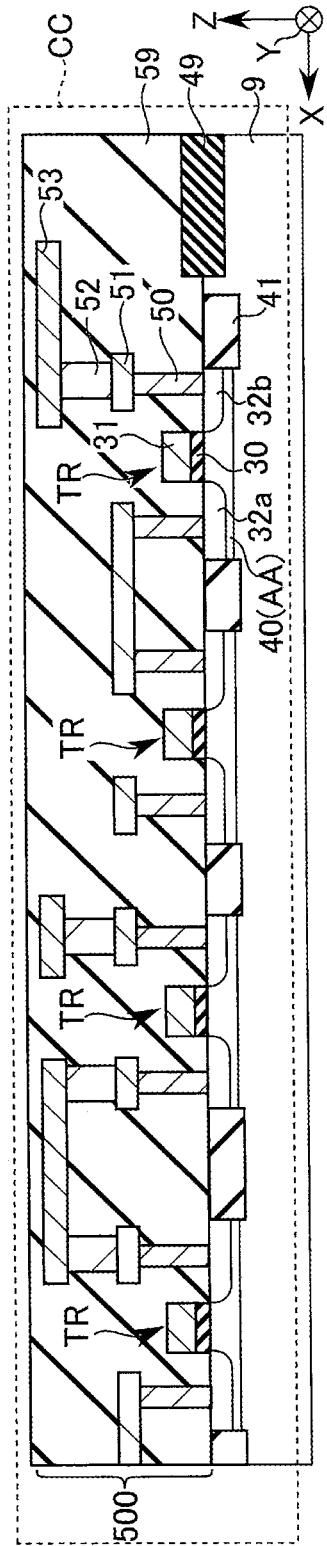

FIG. 8 is a sectional view showing one step of the method for manufacturing the DRAM of the first embodiment.

As shown in FIG. 8, a plurality of transistors TR are formed on active regions AA (well regions 40) of the semiconductor substrate (silicon wafer) 9 by the well-known layer formation technique and well-known lithography/etching technique. Each of the transistors TR includes a gate insulating layer 30, a gate electrode 31 and a source/drain region 32 (32a, 32b).

A plurality of insulating layers (interlayer insulating layers 59) and a plurality of conductive layers (interconnects, plugs and pads) 50, 51, 52 and 53 for the multilevel interconnect structure 500 are formed above the transistors TR and the semiconductor substrate 9 by the well-known multilevel interconnect technique.

Thus, the memory control circuit CC of the DRAM 1 is formed on the semiconductor substrate 9.

Figure 9:
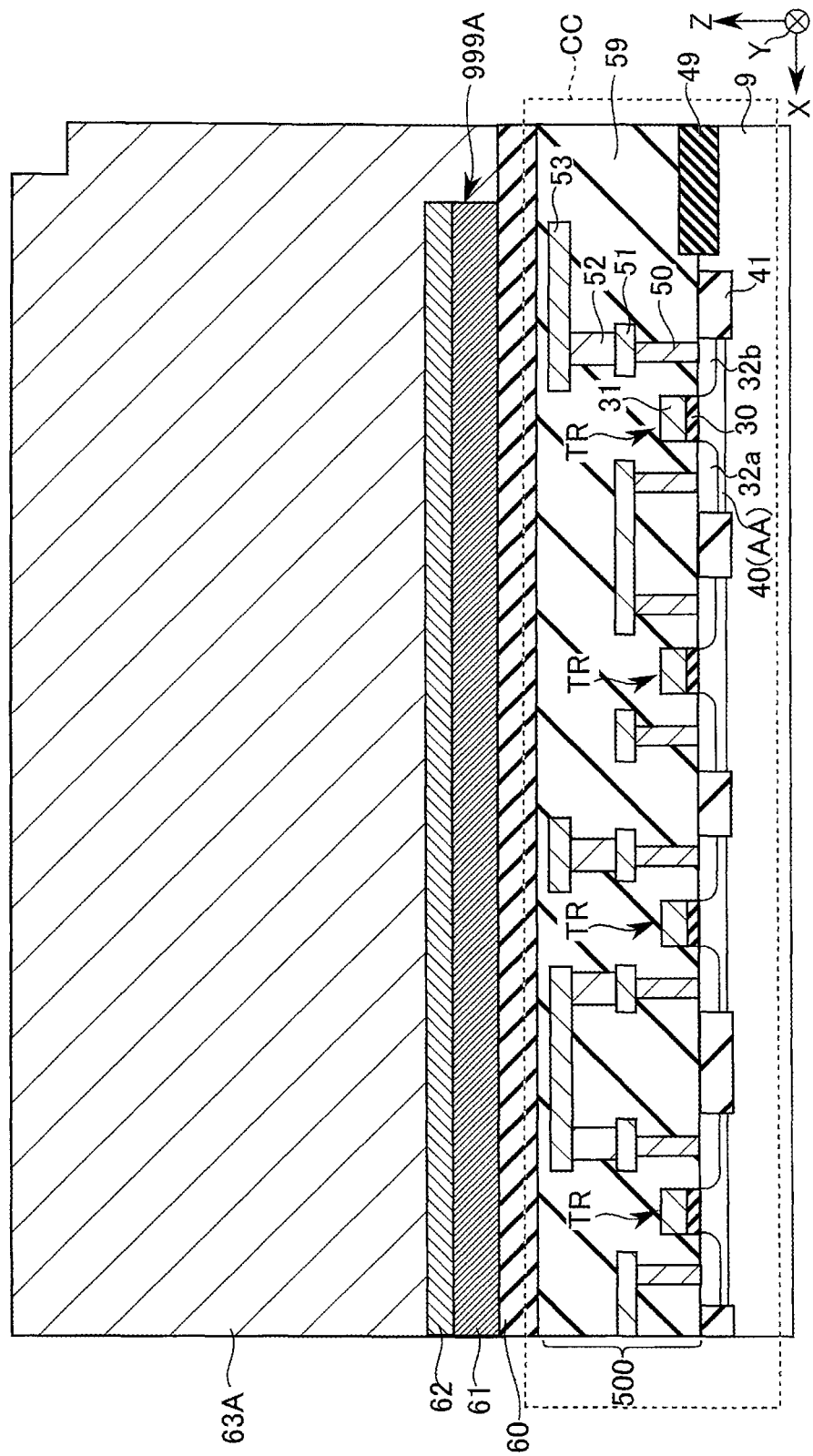

FIG. 9 is a sectional view showing one step of the method for manufacturing the DRAM of the first embodiment.

As shown in FIG. 9, an insulating layer 60 is formed on the multilevel interconnect structure 500 by chemical vapor deposition (CVD), for example. The insulating layer 60 functions as a protective film against the memory control circuit CC on the semiconductor substrate 9 during the anodic oxidation process to be described later.

The material of the insulating layer 60 is oxide, nitride or oxynitride. The insulating layer 60 is, for example, a silicon oxide layer.

Note that the insulating layer 60 may be formed to cover the side and bottom surface of the semiconductor substrate 9 though the insulating layer 60 is shown in FIG. 9 to cover only the top surface of the semiconductor substrate 9. The insulating layer 60 may be formed continuously with the insulating layer of the multilevel interconnect structure 500 (e.g., the uppermost insulating layer of the multilevel interconnect structure 500). In this case, the insulating layer 60 is continuous to the insulating layer of the multilevel interconnect structure 500.

A conductive layer 61 is formed on the insulating layer 60 by sputtering, CVD, ALD, or the like. The conductive layer 61 is, for example, a tungsten layer.

A conductive layer 62 is formed on the conductive layer 61 by sputtering, CVD, ALD, or the like. The conductive layer 62 is, for example, a titanium nitride layer. Note that only the conductive layer 61 may be formed on the insulating layer 60 without forming the conductive layer 62.

A conductive layer 63A is formed on the conductive layer 62. The conductive layer 63A is, for example, an aluminum layer.

For example, the thickness of the aluminum layer 63A is approximately several micrometers (μm) to several hundred micrometers (μm). It is preferable that high-purity aluminum whose purity is 99.90% or more is used for the aluminum layer 63A.

The aluminum layer 63A is formed by, sputtering, plating, CVD, bonding an aluminum layer (aluminum substrate and aluminum foil) to the conductive layer 61, or the like.

For example, the conductive layers 61 and 62 may be removed above the alignment mark 49 in the Z direction. Thus, a step 999A is formed at end portions of the conductive layers 61 and 62. Note that a convex portion including one or more of the layers 60, 61 and 62 may be formed on the multilevel interconnect structure 500 above the alignment mark 49. For example, the convex portion is a step formed in accordance with a member (e.g., an alignment mark) in the semiconductor substrate 9 or the multilevel interconnect structure 500.

Figure 10:
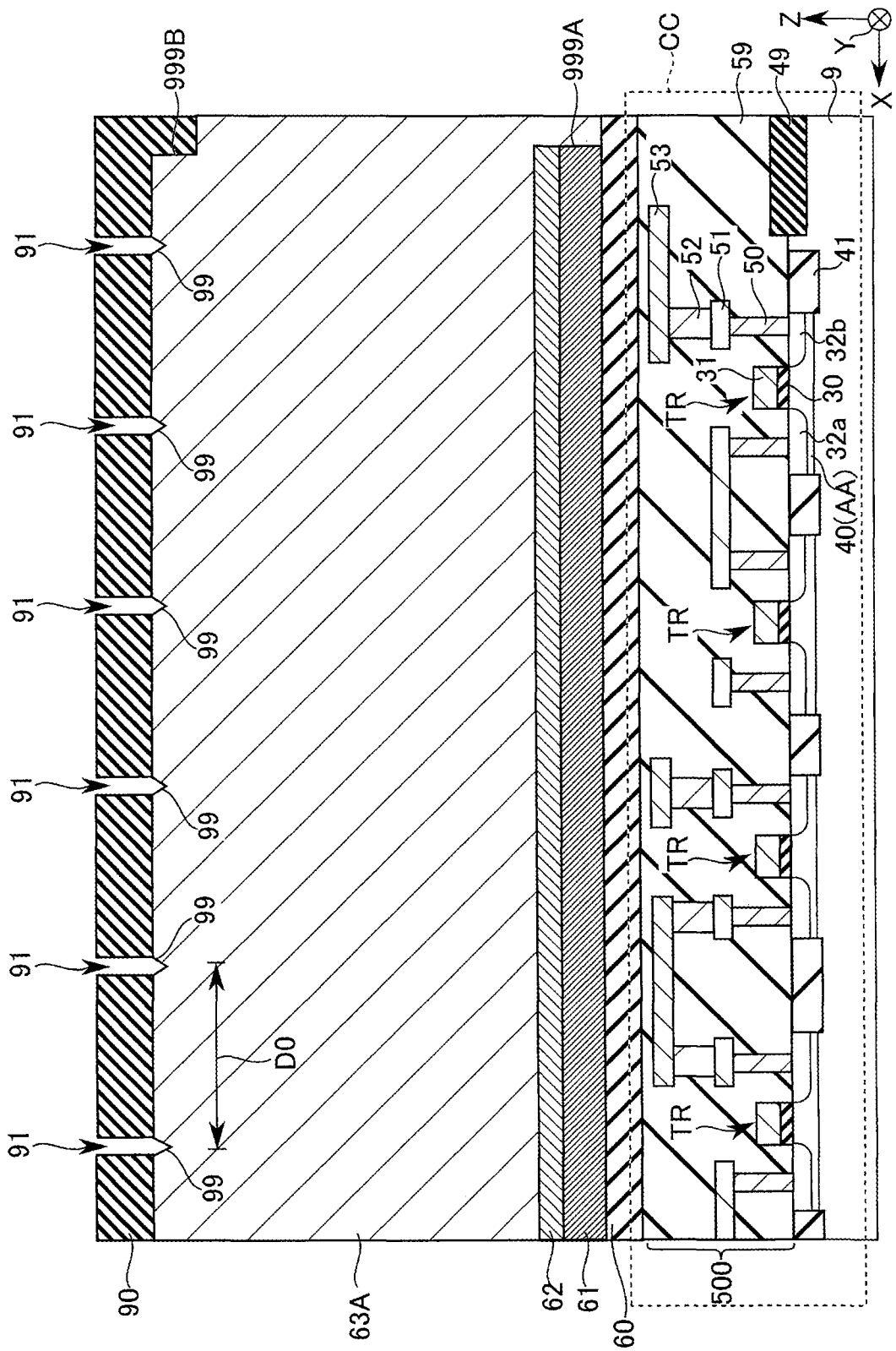

FIG. 10 is a sectional view showing one step of the method for manufacturing the DRAM of the first embodiment. As shown in FIG. 10, a mask layer (e.g., a resist mask or a hard mask) 90 is formed on the surface (top) of the aluminum layer 63A in the Z direction by lithography (e.g., photolithography) and etching. The mask layer 90 has a plurality of openings (holes) 91. The opening 91 are portions for forming a reaction starting point of anodic oxidation to the aluminum layer 63A.

For example, the openings 91 of the mask layer 90 are laid out in the foregoing hexagonal lattice (hexagonal close-packed lattice). Each of the openings 91 has a circular (elliptical) planar shape when viewed from the Z direction.

The pitch D0 between the openings 91 is about several tens of nanometers (nm) to several hundreds of nanometers (nm). The pitch D0 is a distance between the centers of two openings 91 in the Y direction.

For example, the mask layer 90 is patterned by aligning the semiconductor substrate (wafer) 9 with a mask (not shown) using a step 999A of the conductive layers 61 and 62 or a step 999B of the aluminum layer 63A corresponding to the step 999A as an alignment mark. The mask layer 90 may be patterned using the alignment mark 49.

It is preferable to planarize the top surface of the aluminum layer 63A through a planarization process such as CMP before the mask layer 90 is formed.

Based on the pattern of the mask layer 90, the top surface of the aluminum layer 63A is etched by dry etching or wet etching.

Thus, a recess 99 is formed in the top surface of the aluminum layer 63A. The depth (the dimension in a direction perpendicular to the surface of the substrate 40) of the recess 99 is, for example, about several nanometers (nm) to several tens of nanometers (nm).

The recess 99 formed by etching serves as a reaction starting point for anodic oxidation of the aluminum layer 63A.

Figure 11:
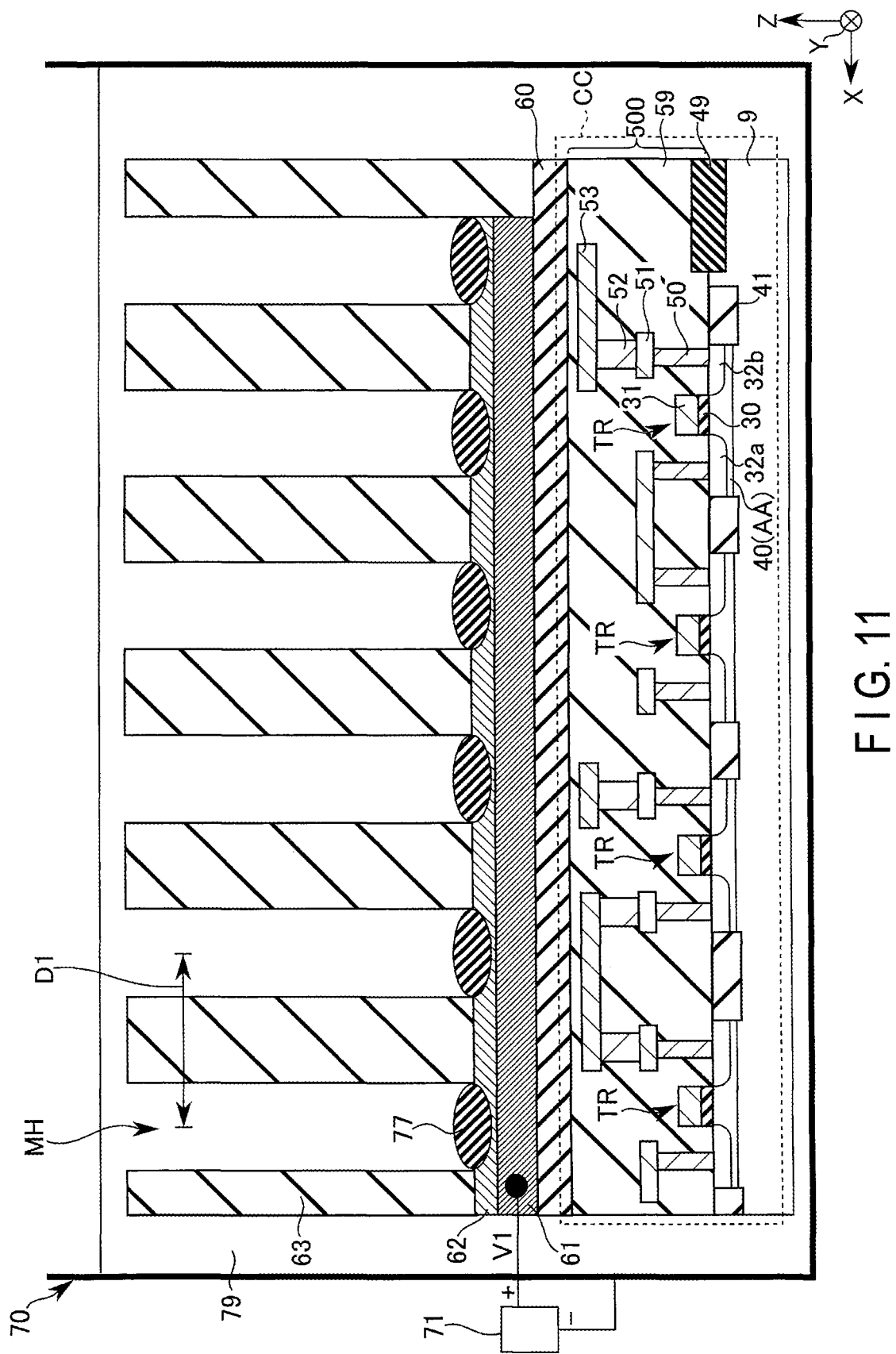

FIG. 11 is a schematic sectional view showing one step of the method for manufacturing the DRAM of the first embodiment.

As shown in FIG. 11, an anodic oxidation process is performed for the aluminum layer.

The aluminum layer and the semiconductor substrate 9 are immersed in an electrolyte solution (sulfuric acid, oxalic acid, phosphoric acid, etc.) 79 in an anodic oxidation device 70.

In the electrolyte solution 79, the conductive layer 61 is set to an anode (also referred to as an anode electrode hereinafter) for the anodic oxidation process. A voltage for the anodic oxidation process (referred to as anodic oxidation voltage hereinafter) V1 is applied to the conductive layer 61 from a voltage circuit 71. The anodic oxidation voltage V1 has a voltage value ranging from 10 V to 30 V, for example.

In the first embodiment, the conductive layer 61 used as an anode in the anodic oxidation process is a layer used as a plate electrode in the memory cell array of the DRAM.

Thus, a voltage for the anodic oxidation of the aluminum layer is applied to the aluminum layer from the outer peripheral portion of the semiconductor substrate (wafer) 9 in the X direction or the Y direction.

In the first embodiment, the insulating layer (e.g., silicon oxide layer) 60 protects the elements TR on the semiconductor substrate 9 as a protective film against the electrolyte solution 79 and the anodic oxidation voltage V1. The elements TR can thus be prevented from being damaged and broken through the anodic oxidation process.

Anodic oxidation of the aluminum layer, a porous aluminum oxide layer (alumina layer) 63 is formed above semiconductor substrate 90 that includes the memory control circuit CC.

If the anodic oxidation voltage V1 is optimized, holes (alumina holes) MH are formed in the alumina layer 63 to extend in a direction (Z direction) perpendicular to the top surface of the semiconductor substrate 9 at pitch D1 corresponding to the pitch of the reaction starting point formed in advance.

If the time of the anodic oxidation process is adjusted, the depth (dimension in the Z direction) of the alumina hole MH can be adjusted to a desired size.

The voltage value of the anodic oxidation voltage V1 is maintained at a constant voltage value without modulation. Thus, the section of the alumina hole MH viewed from the X direction (or Y direction) is substantially quadrangular.

Note that the anodic oxidation voltage V1 may be modulated periodically (at predetermined time intervals) during the anodic oxidation process for the aluminum layer.

Thus, the shape of alumina hole MH to be formed is controlled by forming a reaction starting point in anodic oxidation for the aluminum layer and by controlling the anodic oxidation voltage.

Accordingly, a plurality of alumina holes MH are formed in regular alignment (e.g., at pitch D1 in the X direction) in the memory cell array area.

In the anodic oxidation process in the DRAM manufacturing process of the first embodiment, the anodic oxidation voltage V1 is applied to the entire aluminum layer above the semiconductor substrate (wafer) 9 by the conductive layer 61. With the application of a voltage through the conductive layer 61, the entire aluminum layer for anodic oxidation is oxidized. Therefore, the aluminum layer does not remain on the conductive layer 62.

In the anodic oxidation process, the conductive layer 62 may be oxidized at the bottom of the alumina hole MH depending on the material of the conductive layer 62. In this case, a compound 77 is formed on the conductive layer 62. If the conductive layer 62 is a titanium nitride layer, a titanium oxide (or titanium oxynitride) layer 77 is formed on the titanium nitride layer 62.

For example, the conductive layer 62 functions as a protective film to inhibit the conductive layer 61 from being oxidized (or eroded) in the anodic oxidation process.

Thus, the conductive layer (here, the tungsten layer) 61 used for the anode electrode remains between the aluminum oxide layer 63 and the insulating layer 60 without being oxidized. The conductive layer 62 maintains a plate-like shape.

If the conductive layer 62 is not formed, the top surface of the conductive layer 61 may be oxidized at the bottom of the alumina hole MH. It is therefore preferable that the conductive layer 61 be formed of a material having oxidation resistance.

Figure 12:
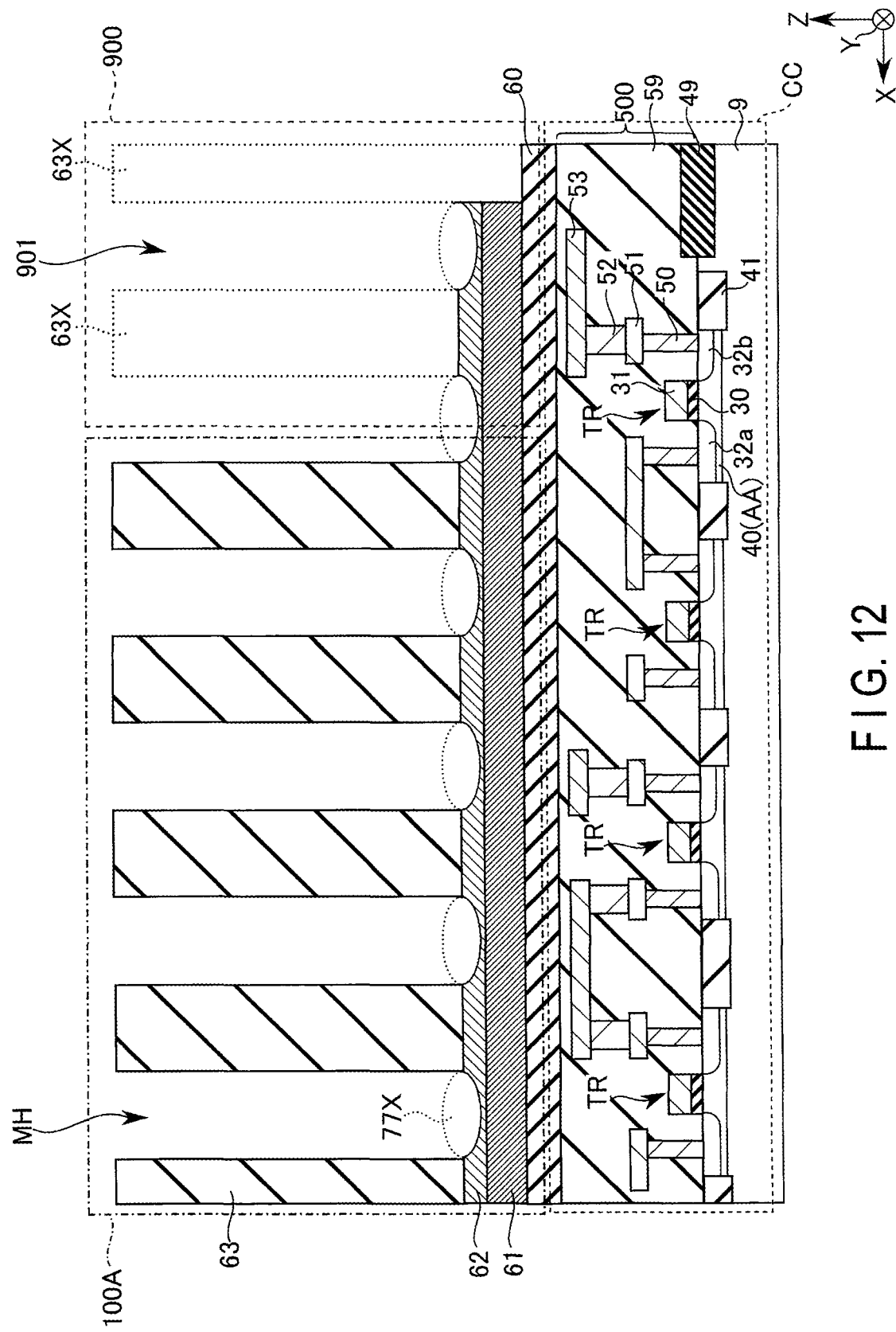

FIG. 12 is a schematic sectional view showing one step of the method for manufacturing the DRAM of the first embodiment.

As shown in FIG. 12, the compound 77X of the conductive layer 62 is selectively removed by etching through the alumina hole MH.

Thus, the top surface of the conductive layer 62 is exposed to the alumina hole MH.

An aluminum oxide layer 63X is selectively removed from an area other than the memory cell array area 100A such as the contact area 900.

Accordingly, in the aluminum oxide layer 63, the opening area 901 is formed in the area (contact area 900) above the contact portion 53 of the memory control circuit in the Z direction.

When the aluminum oxide layer 63 is removed, the aluminum above the semiconductor substrate 9 is converted into a transparent aluminum oxide layer 63. Thus, light for alignment is transmitted to the alignment mark 49 on the semiconductor substrate 9 (or in the multilevel interconnect structure 500). Therefore, the aluminum oxide layer 63 can be removed by mask alignment using the alignment mark 49 alongside the semiconductor substrate 9.

Note that the order of removal of the aluminum oxide layer 63X and the compound 77X is not limited. The compound 77X may be removed after the aluminum oxide layer 63X is removed.

Figure 13:
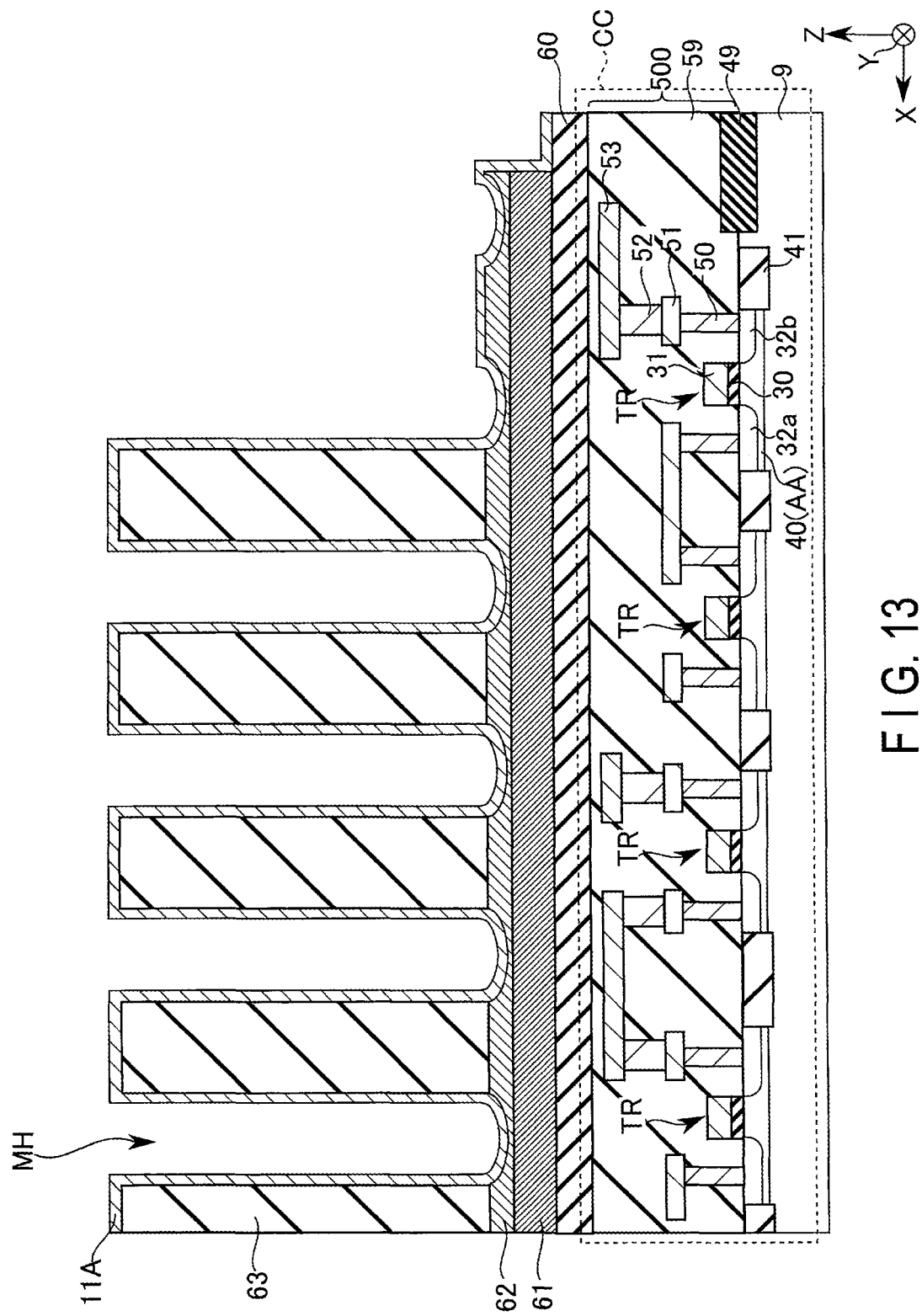

FIG. 13 is a schematic sectional view showing one step of the method for manufacturing the DRAM of the first embodiment.

As shown in FIG. 13, a conductive layer (e.g., a titanium nitride layer) 11A is formed on the aluminum oxide layer 63 and the conductive layer 62 by CVD or ALD. The conductive layer 11A is a layer for forming a capacitor electrode of the cell capacitor.

The thickness of the conductive layer 11A is controlled so that the alumina hole MH is not blocked by the conductive layer 11A. The thickness of the conductive layer 11A is about several nanometers (nm).

Figure 14:
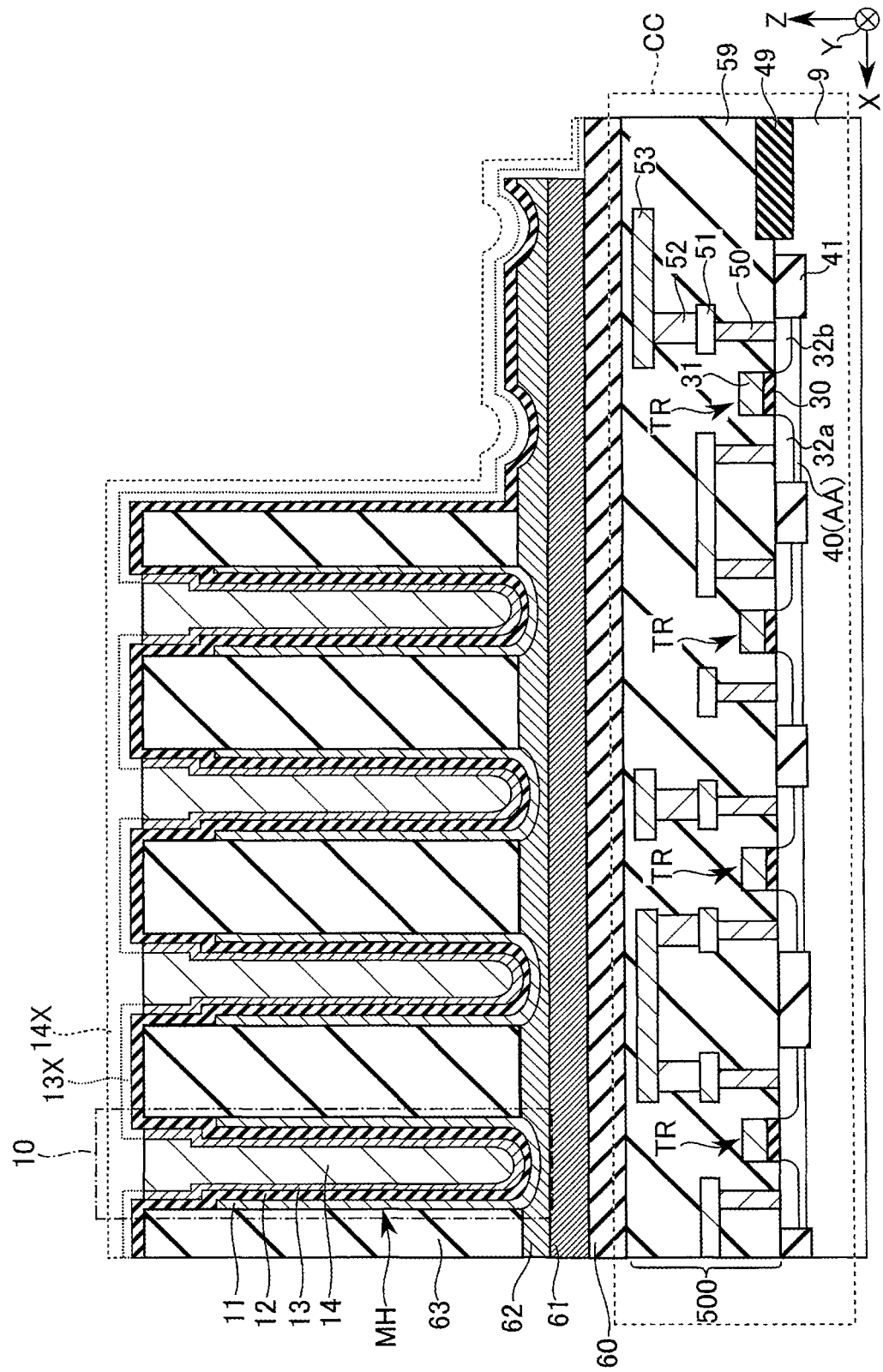

FIG. 14 is a schematic sectional view showing one step of the method for manufacturing the DRAM of the first embodiment.

As shown in FIG. 14, the conductive layer covering the top surface of the aluminum oxide layer 63 is selectively removed by wet etching or dry etching. Accordingly, the conductive layer (capacitor electrode) 11 is separated for each alumina hole MH.

An insulating layer (e.g., a high dielectric insulating layer such as a zirconium oxide layer) 12 is formed on the top surface of the aluminum oxide layer 63 and on the conductive layer 11 by CVD or ALD.

Conductive layers (e.g., titanium nitride layers) 13 and 13X are formed on the insulating layer 12 by CVD or ALD. For example, the thicknesses of the insulating layer 12 and conductive layers 13 and 13X are controlled so that the alumina hole MH is not blocked by the insulating layer 12 and conductive layers 13 and 13X. The thickness of each of the insulating layer 12 and conductive layers 13 and 13X is about several nanometers (nm).

Conductive layers 14 and 14X are formed on the conductive layers 13 and 13X. The alumina hole MH is buried by the conductive layers 14 and 14X. The conductive layers 14 and 14X are silicon layers, silicon germanium layers, or the like.

After that, the conductive layers 13X and 14X on the top surface of the aluminum oxide layer 63 are etched back by wet etching or dry etching. The conductive layers 13 and 14 are thus separated for each alumina hole MH.

Note that the conductive layer 11 and insulating layer 12 may be removed from the top surface of the aluminum oxide layer 63 simultaneously with the etching back of the conductive layers 13X and 14X.

Thus, the cell capacitor 10 is formed in the alumina hole MH of the aluminum oxide layer 63.

FIG. 15 is a schematic sectional view showing one step of the method for manufacturing the DRAM of the first embodiment.

As shown in FIG. 15, a mask layer 93 is formed in the memory cell array area 100A by lithography and etching. The mask layer 93 has an opening in the contact area 900. Based on the mask layer 93, the conductive layers 61 and 62 are selectively removed from the contact area 900.

For example, using the alignment mark 49 provided alongside the semiconductor substrate 9, alignment for forming the mask layer 93 is performed.

In the memory cell array area 100A, the conductive layers 61 and 62 remain below the cell capacitor 10 and the aluminum oxide layer 63. Accordingly, a plate line PL including one or more conductive layers (plate electrode layers) 61 and 62 is formed in the memory cell array area 100A.

Note that the conductive layers 61 and 62 may be removed from the contact area 900 simultaneously with the aluminum oxide layer and/or the member of the cell capacitor 10 in the contact area 900. After the cell capacitor 10 is formed, the aluminum oxide layer and/or the member of the cell capacitor 10 may be removed from the contact area 900 simultaneously with the removal of the conductive layers 61 and 62 from the contact area 900.

Figure 16:
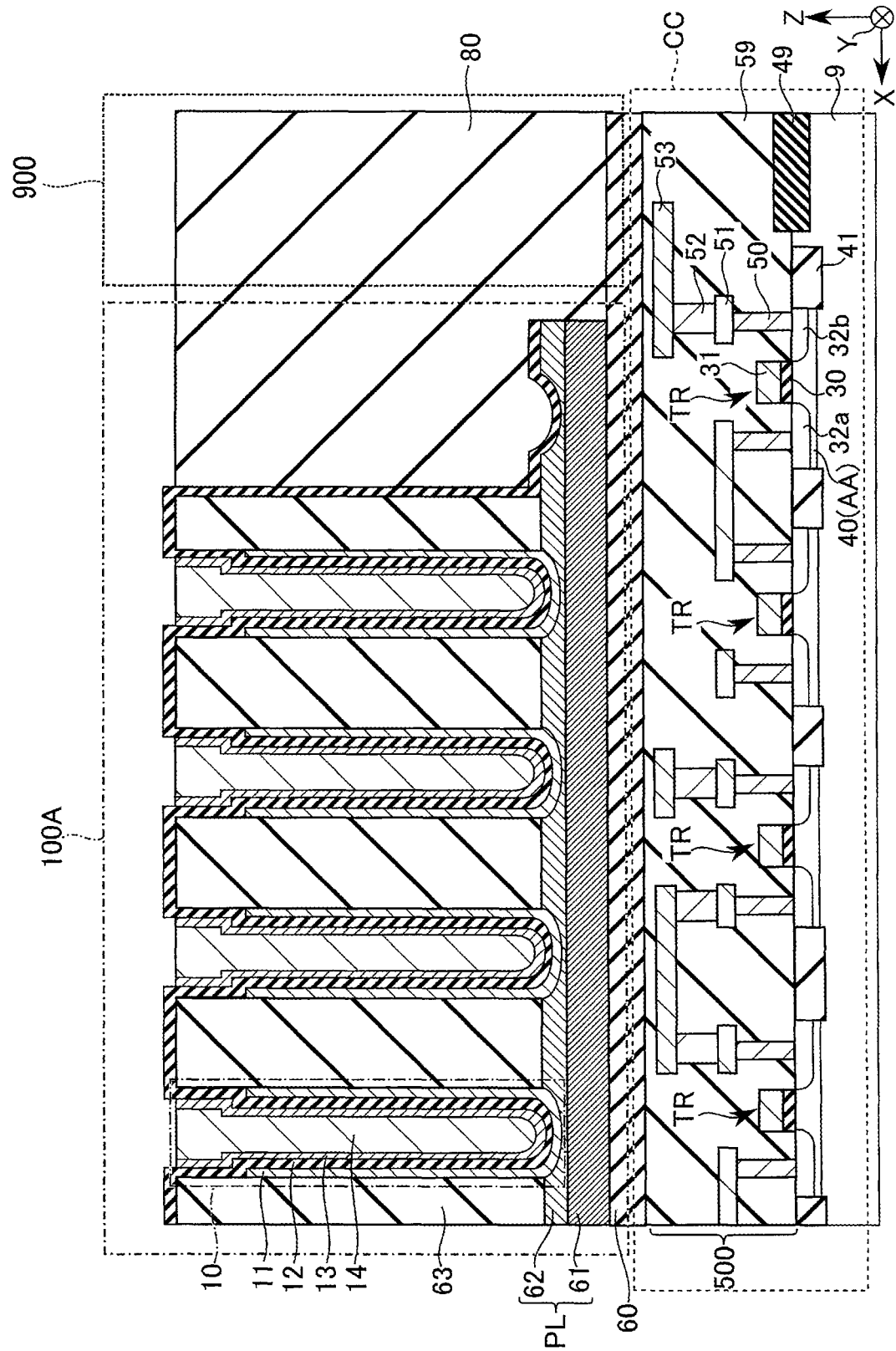

FIG. 16 is a schematic sectional view showing one step of the method for manufacturing the DRAM of the first embodiment.

As shown in FIG. 16, after the mask layer is removed, an insulating layer (e.g., a silicon oxide layer) 80 is formed in the memory cell array area 100A and the contact area 900 above the semiconductor substrate 9 in the Z direction by CVD, coating or the like. The insulating layer 80 is deposited on the conductive layers 13 and 14 and the insulating layers 12, 60 and 63. The insulating layer 80 is embedded in the contact area 900 (in a space adjacent to the memory cell array area 100A in the X and Y directions).

Etching back and CMP are applied to the top surface of the formed insulating layer 80. The top surface of the insulating layer 80 is planarized.

Thus, the insulating layer 80 is formed in the contact area 900.

Figure 17:
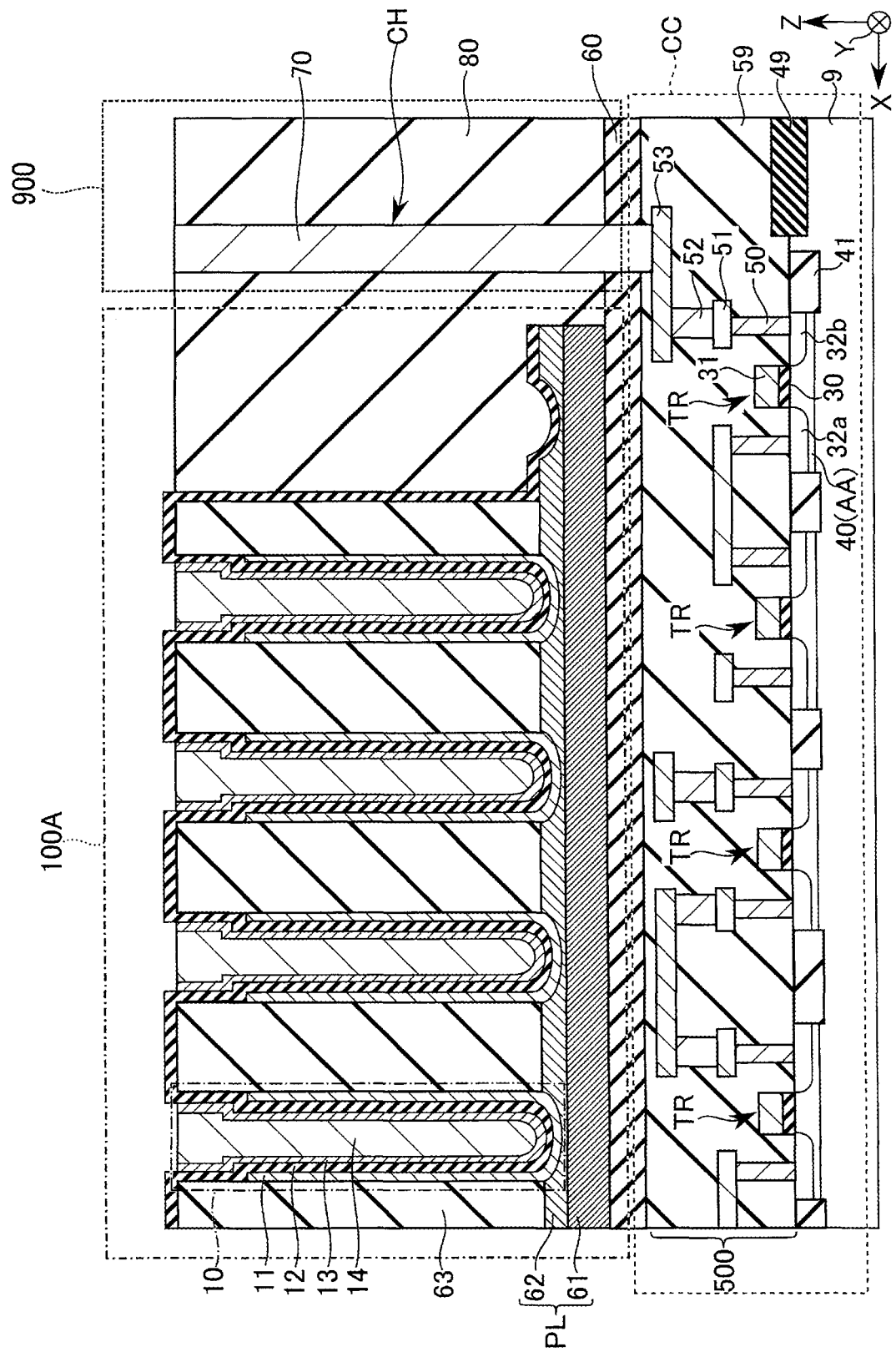

FIG. 17 is a schematic sectional view showing one step of the method for manufacturing the DRAM of the first embodiment.

As shown in FIG. 17, a contact hole CH is formed in the insulating layers 60 and 80 (and insulating layer 59) at a predetermined position in the contact area 900 by known lithography and etching. Below the contact area 900 in the Z direction, the top surface of the conductive layer 53 in the multilevel interconnect structure 500 is exposed through the contact hole CH.

A contact plug 70 is formed in the contact hole CH by the well-known technique. The contact plug 70 is in contact with the top surface of the conductive layer 53. The contact plug 70 is electrically connected to the memory control circuit CC via the conductive layer 53.

Figure 18:
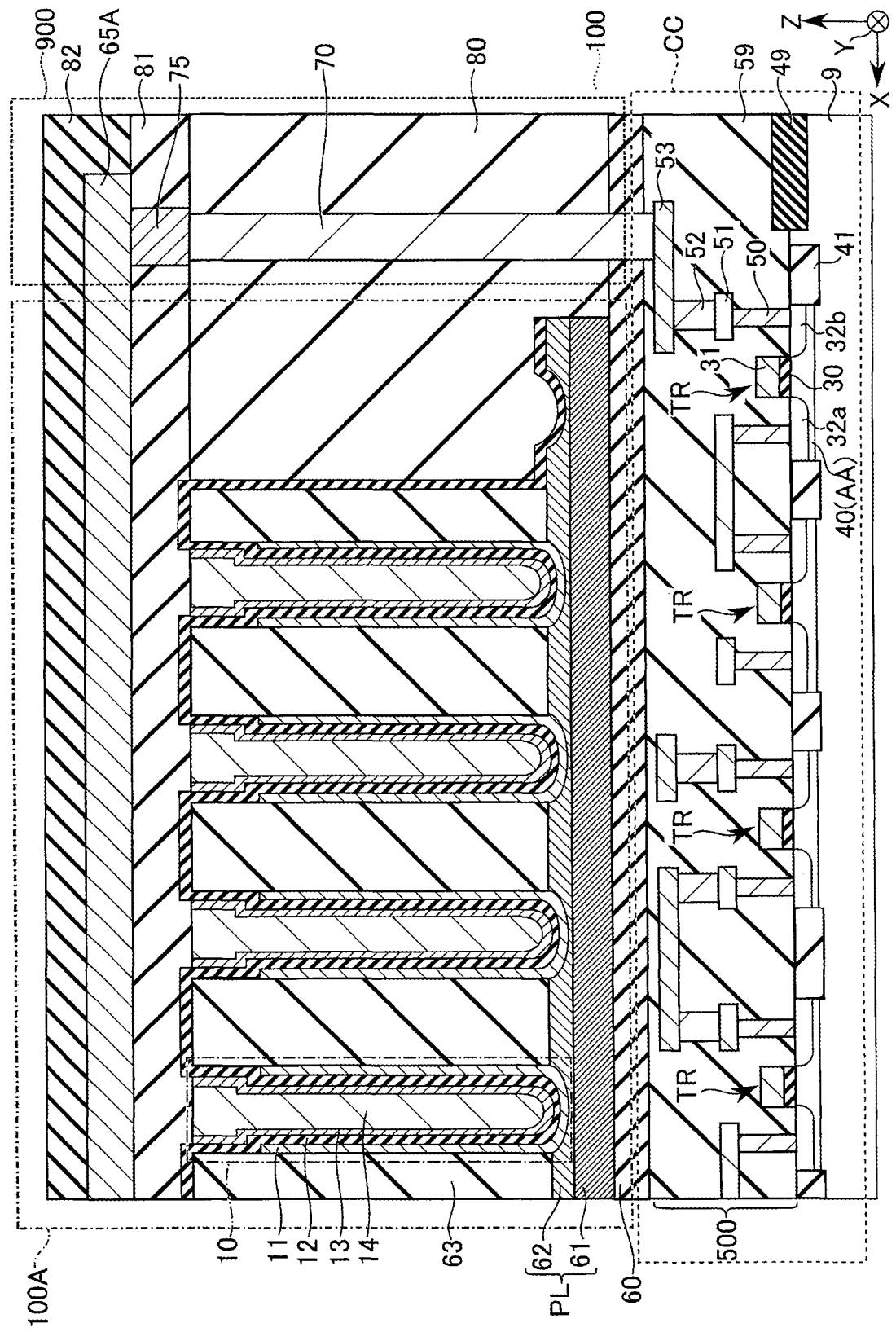

FIG. 18 is a schematic sectional view showing one step of the method for manufacturing the DRAM of the first embodiment.

As shown in FIG. 18, an insulating layer 81 is formed on the insulating layers 12 and 80 and the conductive layers 13 and 14 by the well-known technique. A contact hole is formed in the insulating layer 81. Accordingly, the top surface of the contact plug 70 is exposed.

A via plug (contact portion) 75 is buried in the contact hole of the insulating layer 81. The via plug 75 is formed on the contact plug 70 in the Z direction.

A plurality of conductive layers 65A having a predetermined pattern are formed on the insulating layer 81 by sputtering and lithography/etching. The conductive layers 65A are connected to the contact plug 75, for example. For example, the conductive layers 65A are layers for forming the word lines WL.

After that, as shown in FIGS. 4 to 6, a plurality of cell transistors 20 and bit lines BL are formed.

The cell transistors 20 are formed above the aluminum oxide layer 63 in the Z direction by the well-known technique. The cell transistors 20 are formed above their respective cell capacitors 10 in the Z direction.

For example, an opening is formed in the insulating layers 81 and 82 and the conductive layer 65. Accordingly, the top surface of the conductive layer (storage node electrode) 14 of the cell capacitor 10 is exposed. A gate insulating layer 22 is formed in the opening. The gate insulating layer 22 covers the sides of the of the insulating layers 81 and 82 and conductive layer 65 (the surfaces thereof along the Z direction). After the insulating layer 22 is selectively removed from the top of the storage node electrode 14, a semiconductor layer (e.g., an oxide semiconductor layer) 21 is formed in the opening. The semiconductor layer 21 faces the conductive layer 23 through the gate insulating layer 22.

Thus, the cell transistor 20 is formed. The cell transistor 20 is electrically connected to the cell capacitor 10.

When an oxide semiconductor layer (e.g., an InGaZnO layer or an InAlZnO layer) is used for the semiconductor layer (body portion) 21 of the cell transistor 20, the oxide semiconductor layer can be formed by a relatively low temperature process. In this case, therefore, the characteristics of the cell capacitor 10 and/or the transistor TR on the semiconductor substrate 9 can be prevented from being degraded by the heat generated in the cell transistor forming process, as compared with the case where the semiconductor layer 21 is formed by the high-temperature process.

After that, interconnects (e.g., bit lines) 66 and pads (not shown) are formed on insulating layer 82. The bit lines 66 are connected to the semiconductor layer 21. For example, an insulating layer (not shown) is formed on the bit lines 66 and pads. A wafer is diced into chips of the DRAM.

As described above, the DRAM of the first embodiment is formed.

(c) Summary

The configurations and manufacturing methods of various memory devices have been studied and developed in order to improve the storage density of the memory devices and reduce the manufacturing costs thereof.

In the memory device (e.g., DRAM) of the first embodiment, an anodic oxidation process is used to form the memory cell array 100. The memory cell array 100 includes memory cells, which are provided in the aluminum oxide layer 63. In the first embodiment, the memory cells include capacitors 10 as memory elements. The capacitors 10 are provided in the holes MH in an aluminum oxide layer 63.

As described above, the aluminum oxide layer 63 is formed by the anodic oxidation process and thus the holes MH can be formed at relatively equal pitches D1 and D2.

The holes MH formed in the aluminum oxide layer 63 by the anodic oxidation process have a relatively high aspect ratio (a ratio between the dimension of the hole in a direction parallel to the surface of the semiconductor substrate and the dimension thereof in a direction perpendicular to the surface of the semiconductor substrate). Therefore, when the cell capacitor is formed by the anodic oxidation process as in the first embodiment, its capacitance is relatively large even though the diameter of the hole is shrunk.

As a result, the memory device of the first embodiment can improve in its data holding characteristics.

The anodic oxidation process of wet process allows high aspect holes to be formed in the layer at a relatively low cost, as compared with hole formation by dry etching.

As a result, the memory device and its manufacturing method of the first embodiment can reduce the manufacturing costs.

In the first embodiment, the insulating layer 60 is provided between the aluminum oxide layer 63 of the memory cell array 100 and the semiconductor substrate 9 (multilevel interconnect structure 500 of the memory control circuit CC). The insulating layer 60 functions as a protective film of the memory control circuit CC against a solvent for anodic oxidation and/or an applied voltage for anodic oxidation when the aluminum layer above the semiconductor substrate 9 is anodized.

Thus, even though the aluminum layer above the semiconductor substrate 9 including the memory control circuit CC is anodized, the insulating layer 60 protects a 2S plurality of elements (e.g., transistors TR) in the memory control circuit CC from the solvent for anodic oxidation and the applied voltage.

Therefore, the memory device of the present embodiment and the manufacturing method thereof can prevent the characteristics of the memory control circuit CC from being degraded by the anodic oxidation process.

In the first embodiment, the cell transistors of the memory cells are formed after the anodic oxidation process is performed for the aluminum layer. In the embodiment, therefore, the degradation of the characteristics of the cell transistors due to the anodic oxidation process does not occur substantially.

If an oxide semiconductor layer is used as the semiconductor layer of the cell transistors, it can be formed at a relatively low process temperature. It is thus possible to prevent an element (e.g., a cell capacitor and a transistor of the CMOS circuit), which is formed in the previous manufacturing process of the cell transistors, from being damaged by heat in the cell transistor forming process.

As a result, the memory device of the first embodiment and the manufacturing method thereof can improve in the characteristics of the memory device.

A plurality of contact plugs 70 are provided in areas 900 which are adjacent to the memory cell array 100 in the X and Y directions. The contact plugs 70 electrically connect the memory cell array 100 to the memory control circuit CC.

According to the first embodiment, therefore, even though the memory cell array 100 is formed on the semiconductor substrate which is provided with the memory control circuit CC through the anodic oxidation process, the memory cell array 100 is electrically connected to the memory control circuit CC below the memory cell array 100 without using a complex manufacturing process and/or a high-cost manufacturing process.

As a result, the memory device of the first embodiment and the manufacturing method thereof can prevent the memory device from being manufactured at high costs.

As described above, the memory device of the first embodiment can provide a memory device to be manufactured at low costs. The first embodiment can provide a memory device having high performance.

The memory device manufacturing method according to the first embodiment can reduce the manufacturing costs of the memory device.

(2) Second Embodiment

A memory device of a second embodiment and a method for manufacturing the memory device will be described with reference to FIGS. 19 and 20.

Figure 19:
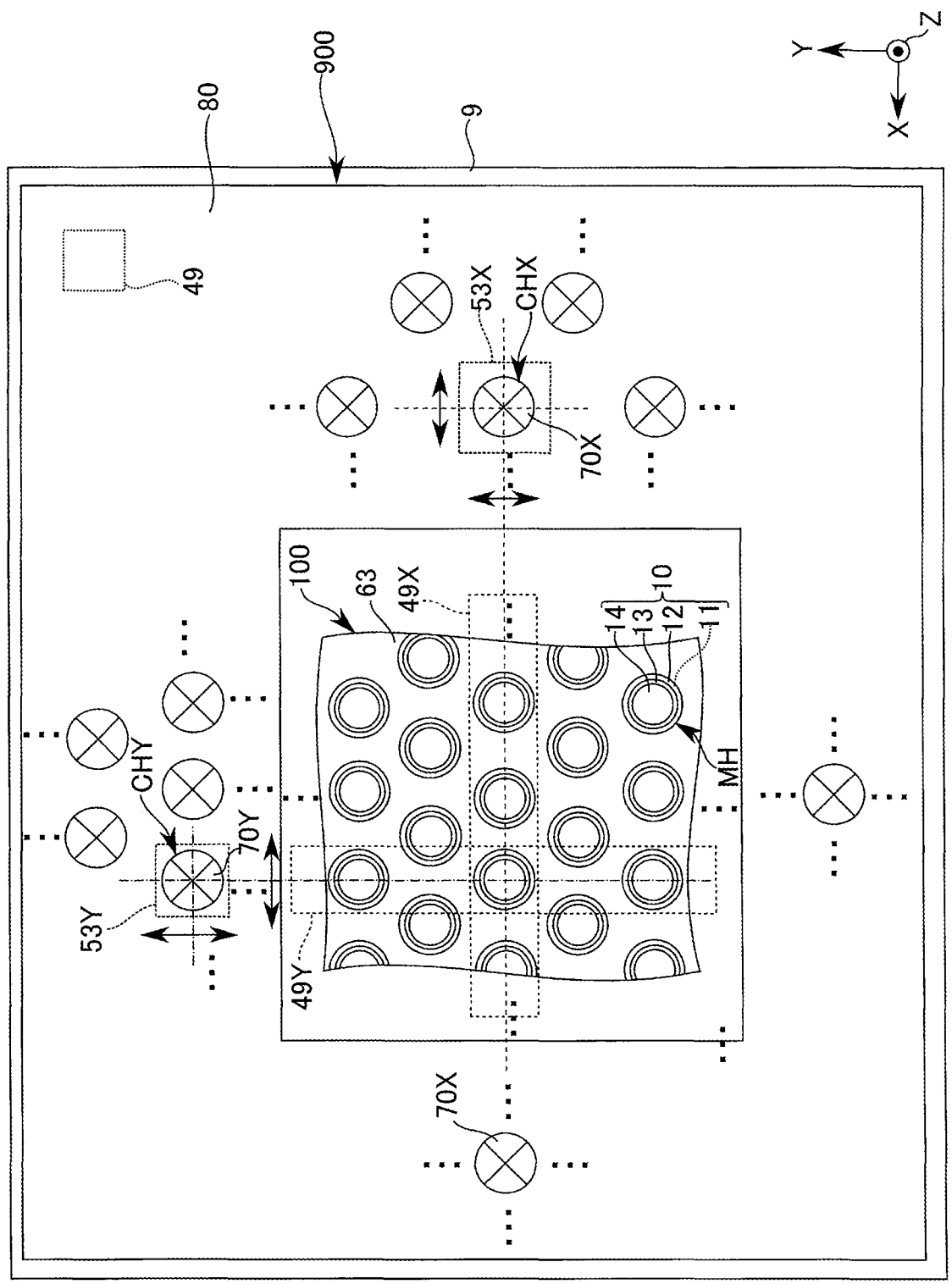
FIGS. 19 and 20 are diagrams each showing one step of a method for manufacturing a memory device of a second embodiment.

FIG. 19 is a top view showing one step of the manufacturing method of a memory device (e.g., a DRAM) of the second embodiment.

As shown in FIG. 19, an aluminum oxide layer including a plurality of alumina holes (a porous aluminum oxide layer) is formed by the anodic oxidation process as described above. A plurality of cell capacitors 10 are formed in the aluminum oxide layer 63.

After that, contact plugs (e.g., word line contacts) 70X are formed in the contact area 900. Contact holes CH (CHX, CHY) are formed in the contact area 900 based on a mask pattern. The contact plugs 70 (70X, 70Y) are embedded in the contact hole CH.

In the second embodiment, with respect to an arraignment of the mask at the time of formation of the contact plug 70, a formation position (placement coordinates) of the contact hole CHX (and the contact plug 70) in the X direction is aligned using different members between an alignment of a position (coordinates) in the X direction and an alignment of a position (coordinates) in the Y direction.

The forming position of the contact hole CHX in the X direction is set based on the contact portion (plug or pad) 53X alongside the semiconductor substrate 9 (on the semiconductor substrate 9 or in the multilevel interconnect structure 500). Note that the planar shape of the contact portion 53X alongside the semiconductor substrate 9 may be circular (elliptical) though it is square for visibility in FIG. 19.

The forming position of the contact hole CHX in the Y direction is set using at least one cell capacitor 10 (e.g., two or more cell capacitors 10 aligned in the X direction) in the memory cell array area 100A as an alignment mark 49X.

As described above, the alumina holes MH and cell capacitors 10 in the aluminum oxide layer 63 that is formed by anodic oxidation, are arrayed in the X-Y plane at relatively equal pitches. It is thus useful to use the cell capacitor 10 as a mark for mask alignment as in the second embodiment.

Thus, a plurality of contact holes CHX and a plurality of contact plugs 70X are formed in the contact area 900 by the well-known technique so that the positions of the contact holes CHX and contact plugs 70X match with those of the word lines to be formed in a later step.

For example, a plurality of word line contacts 70 X are laid out in the contact area 900 so as to be adjacent obliquely in a direction parallel to the X and Y directions.

After that, as described above, each conductive layer for forming the word lines is formed above a plurality of cell capacitors 10 arrayed in the X direction.

When the contact plug 70Y is formed in an area of the contact area 900 in the Y direction, the cell capacitors 20 arranged in the Y direction may use an alignment mark (reference member) for mask alignment, as in the example of forming a word line contact.

For example, in the mask alignment at the time of formation of the contact plugs (e.g., bit line contacts) 70Y for connecting the bit lines BL and the memory control circuit CC, a contact member (e.g., a contact in the multilevel interconnect structure 500) 53Y alongside the semiconductor substrate 9 is used as a reference of the forming position (array coordinates) of the contact holes CHY (and the contact plugs 70Y) in the Y direction. In the memory cell array 100, a plurality of cell capacitors 10 arrayed in the Y direction are used as an alignment mark 49Y for a reference of the forming position of the contact holes in the X direction.

Thus, a plurality of contact plugs 70Y are formed in the contact area 900 so that the positions of the contact plugs 70Y match those of the bit lines to be formed in a later step.

With respect to the alignment for forming the contact holes CH and the contact plugs 70 in the second embodiment, the alignment mark 49 in the semiconductor substrate 9 (or the multilevel interconnect structure 500) may be used as a member on the semiconductor substrate side.

In addition, after rough alignment of the mask is performed based on the alignment mark 49, fine adjustment of the mask alignment may be performed using the contact portions on the semiconductor substrate side and the member (e.g., cell capacitors) in the memory cell array.

Figure 20:
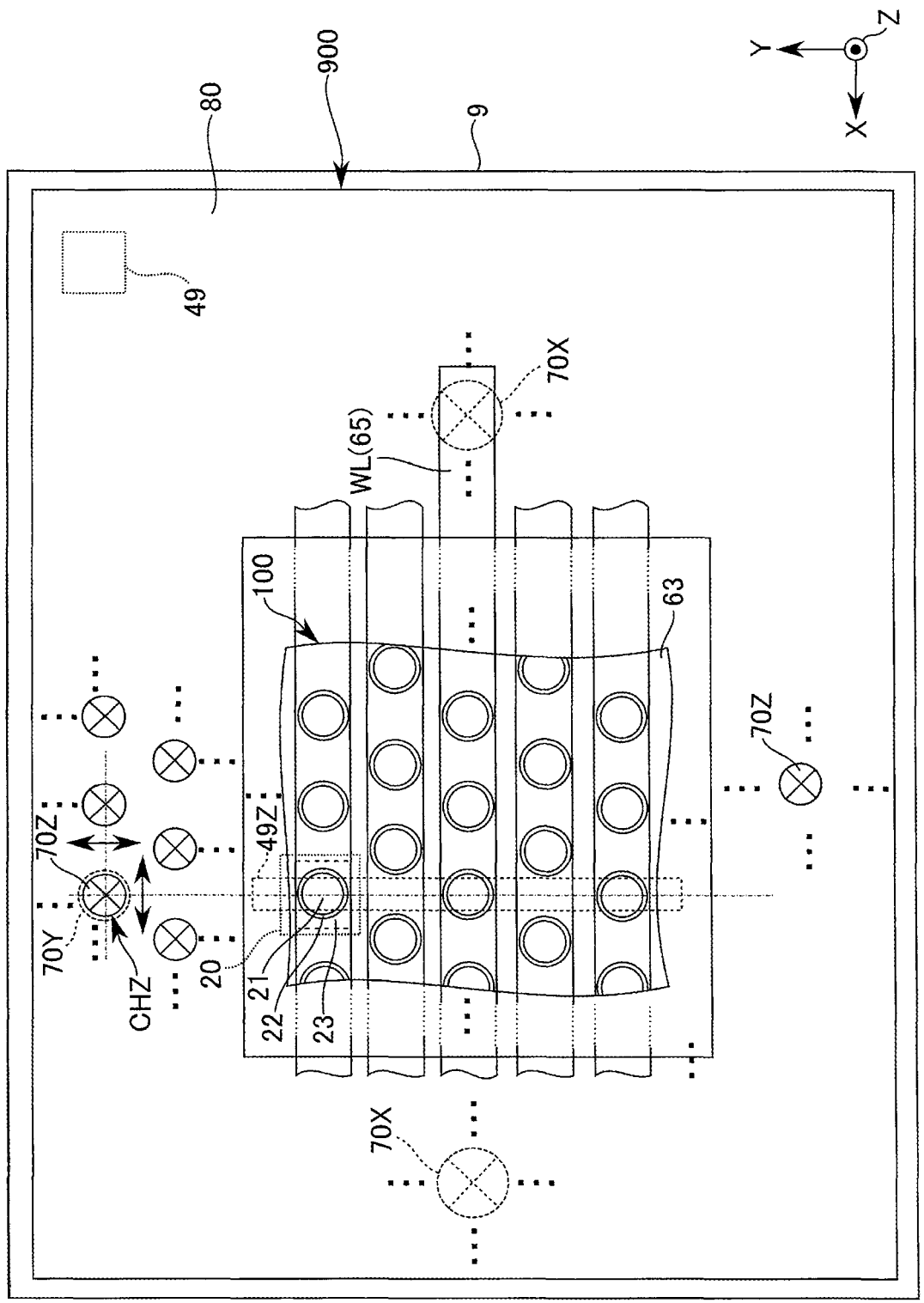

FIG. 20 is a top view showing one step of the manufacturing method of a memory device (e.g., a DRAM) of the second embodiment.

The mask alignment for forming the contact portions may be performed using the cell transistor 20 as an alignment mark as shown in FIG. 20.

For example, a contact portion 70Z (e.g., the via plug 75 described above) is formed after formation of the cell transistors 20 and before formation of the bit lines BL.

When the contact portion 70Z is formed, the forming position of the contact portion 70Z in the Y direction is set based on the contact plug 70Y in the contact area 70 with respect to the mask alignment for forming the contact holes CHZ.

The forming position of the contact portion 70Z in the X direction is set using the cell transistor 20 (e.g., two or more cell transistors 20 aligned in the Y direction) in the memory cell array area 100A as an alignment mark 49Z.

Thus, a plurality of contact holes CHZ and a plurality of contact portions 70Z are formed in the contact area 900 by the well-known technique so that the positions of the contact plugs 70Z are aligned with those of the bit lines to be formed in a later step.

Note that the contact portions in the X direction in the contact area 900 may be formed using the cell transistor 20 as the alignment mark 49 as in the example of FIG. 20.

In accordance with the aluminum layer forming method to which the anodic oxidation process is applied, the accuracy of alignment for forming the reaction starting point of the alumina holes may be lowered. Accordingly, with respect to the connection between the interconnect of the memory control circuit and the interconnect (word lines and bit lines) of the memory cell array formed after the anodic oxidation process, the accuracy of alignment for forming the contact portions connecting the interconnect of the memory cell array and the memory control circuit is lowered.

For example, due to a reduction in alignment accuracy, a plurality of word lines adjacent in the Y direction are connected to one contact plug, and a plurality of bit lines adjacent in the X direction are connected to one contact plug.

In the second embodiment, alignment for forming the contact plugs after the anodic oxidation process is performed using a member (e.g., the contact portions of the memory control circuit) provided on the semiconductor substrate side and a member (e.g., cell capacitor 10) formed after the anodic oxidation process.

Thus, in the second embodiment, the accuracy of alignment between the interconnects in the memory cell array and the memory control circuit and the contact plugs is improved. For example, according to the second embodiment, a short circuit of the interconnect in the memory cell array is reduced.

As a result, the memory device manufacturing method of the second embodiment can improve the manufacturing yield of the memory device.

As described above, the memory device manufacturing method of the second embodiment can reduce the manufacturing costs of the memory device.

(3) Others

In the first and second embodiments, a DRAM is exemplified as a memory device. However, a memory device other than the DRAM may be used if it includes a porous aluminum oxide layer formed by anodic oxidation.

In the first and second embodiments, a memory device is exemplified. However, a device other than the memory device may be used if it includes a porous aluminum oxide layer formed by anodic oxidation.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory device comprising:
a semiconductor substrate;
a circuit provided on a first surface of the semiconductor substrate and including a first contact portion;
an aluminum oxide layer provided above the semiconductor substrate in a first direction perpendicular to the first surface;
a memory cell including a capacitor, the capacitor being provided in the aluminum oxide layer;
a first conductive layer provided between the semiconductor substrate and the aluminum oxide layer in the first direction and electrically connected to the memory cell;
a first insulating layer provided between the first conductive layer and the semiconductor substrate in the first direction;
a second insulating layer adjacent to the aluminum oxide layer in a second direction parallel to the first surface and provided above the semiconductor substrate in the first direction; and
a second contact portion provided in the second insulating layer and above the first contact portion in the first direction to electrically connect the memory cell to the first contact portion,
wherein the capacitor includes:
a second conductive layer;
a third conductive layer provided between the aluminum oxide layer and the second conductive layer, and connecting the aluminum oxide layer and the first conductive layer; and
a third insulating layer provided between the second conductive layer and the third conductive layer.

2. The memory device according to claim 1, further comprising:
a word line provided above the aluminum oxide layer in the first direction and electrically connected to the memory cell; and
a bit line provided above the aluminum oxide layer in the first direction and connected to the memory cell,
wherein the memory cell is electrically connected to the second contact portion via the word line or the bit line.

3. The memory device according to claim 1, wherein the capacitor extends in the first direction in the aluminum oxide layer.

4. The memory device according to claim 1, wherein the capacitor is in contact with the first conductive layer.

5. The memory device according to claim 4, wherein a thickness of the first conductive layer in the first direction between the capacitor and the first insulating layer is smaller than a thickness of the first conductive layer in the first direction between the aluminum oxide layer and the first insulating layer.

6. The memory device according to claim 1, wherein:
the memory cell includes a cell transistor provided above the aluminum oxide layer in the first direction; and
the cell transistor includes an oxide semiconductor layer.

7. The memory device according to claim 6, wherein the oxide semiconductor layer includes at least one of indium, gallium and zinc.

8. The memory device according to claim 1, wherein a material of the first insulating layer and a material of the second insulating layer are different from aluminum oxide.

9. The memory device according to claim 1, wherein:
the first conductive layer includes a titanium nitride layer and a tungsten layer; and
the titanium nitride layer is provided between the tungsten layer and the aluminum oxide layer.

10. The memory device according to claim 1, wherein:
the first insulating layer is provided on the first surface; and
the first insulating layer covers the circuit.

11. The memory device according to claim 6, further comprising: a fourth conductive layer electrically connected to the second conductive layer and the cell transistor.

* * * * *